(12) United States Patent
Han

(10) Patent No.: US 11,010,579 B2
(45) Date of Patent: May 18, 2021

(54) FINGERPRINT SENSOR MODULE AND FINGERPRINT RECOGNITION APPARATUS HAVING SAME

(71) Applicants: LEADING UI CO., LTD., Anyang-si (KR); Sang-hyun Han, Anyang-si (KR)

(72) Inventor: Sang-hyun Han, Anyang-si (KR)

(73) Assignee: LEADING UI Co., Ltd.

( * ) Notice: Subject to any disclaimer, the term of this patent is extended or adjusted under 35 U.S.C. 154(b) by 0 days.

(21) Appl. No.: 16/485,161

(22) PCT Filed: Jan. 8, 2018

(86) PCT No.: PCT/KR2018/000378
§ 371 (c)(1),
(2) Date: Aug. 11, 2019

(87) PCT Pub. No.: WO2018/190494
PCT Pub. Date: Oct. 18, 2018

(65) Prior Publication Data
US 2020/0218869 A1 Jul. 9, 2020

(30) Foreign Application Priority Data
Apr. 14, 2017 (KR) .................... 10-2017-0048663

(51) Int. Cl.
*G06K 9/00* (2006.01)
*H03K 17/96* (2006.01)

(52) U.S. Cl.
CPC ....... *G06K 9/0002* (2013.01); *G06K 9/00087* (2013.01); *H03K 17/96* (2013.01)

(58) Field of Classification Search
CPC ... G06K 9/0002; G06K 9/00087; H03K 17/96
See application file for complete search history.

(56) References Cited

U.S. PATENT DOCUMENTS

| | | | |
|---|---|---|---|
| 2003/0015646 A1* | 1/2003 | Deconde | G06K 9/0002 250/208.1 |
| 2004/0129787 A1* | 7/2004 | Saito | G06K 19/07 235/492 |

(Continued)

FOREIGN PATENT DOCUMENTS

| | | |
|---|---|---|
| CN | 105828590 A | 8/2016 |
| KR | 10-2003-0073567 A | 9/2003 |

(Continued)

OTHER PUBLICATIONS

International Search Report dated on Mar. 30, 2018.

*Primary Examiner* — Stephen G Sherman
(74) *Attorney, Agent, or Firm* — Leepi

(57) ABSTRACT

A fingerprint sensor module and a fingerprint recognition device having the fingerprint sensor module are disclosed. A fingerprint sensor module includes a base film, a thin-film transistor sensor array, and a plurality of first signal lines, an external component and a plurality of second signal lines. The base film includes a fingerprint sensing area, a wing area surrounding the fingerprint sensing area, a first signal connecting area adjacent to the fingerprint sensing area, a component mounting area adjacent to the first signal connecting area, and a second signal connecting area adjacent to the component mounting area. The TFT sensor array is formed in the fingerprint sensing area. The first signal lines are formed in the first signal connecting area. The second signal lines are formed in the second signal connecting area.

12 Claims, 19 Drawing Sheets

(56) References Cited

U.S. PATENT DOCUMENTS

| | | | | |
|---|---|---|---|---|
| 2005/0083768 A1* | 4/2005 | Hara | ............... | G06K 9/0002 |
| | | | | 365/232 |
| 2015/0030217 A1* | 1/2015 | Wickboldt | ............ | G06F 3/0443 |
| | | | | 382/124 |
| 2017/0124373 A1* | 5/2017 | Liao | ............... | H01L 27/14612 |

FOREIGN PATENT DOCUMENTS

| | | | |
|---|---|---|---|
| KR | 10-2014-0130587 | A | 11/2014 |
| KR | 10-2015-0115607 | A | 10/2015 |
| KR | 10-2016-0140231 | A | 12/2016 |
| KR | 10-2017-0016265 | A | 2/2017 |

* cited by examiner

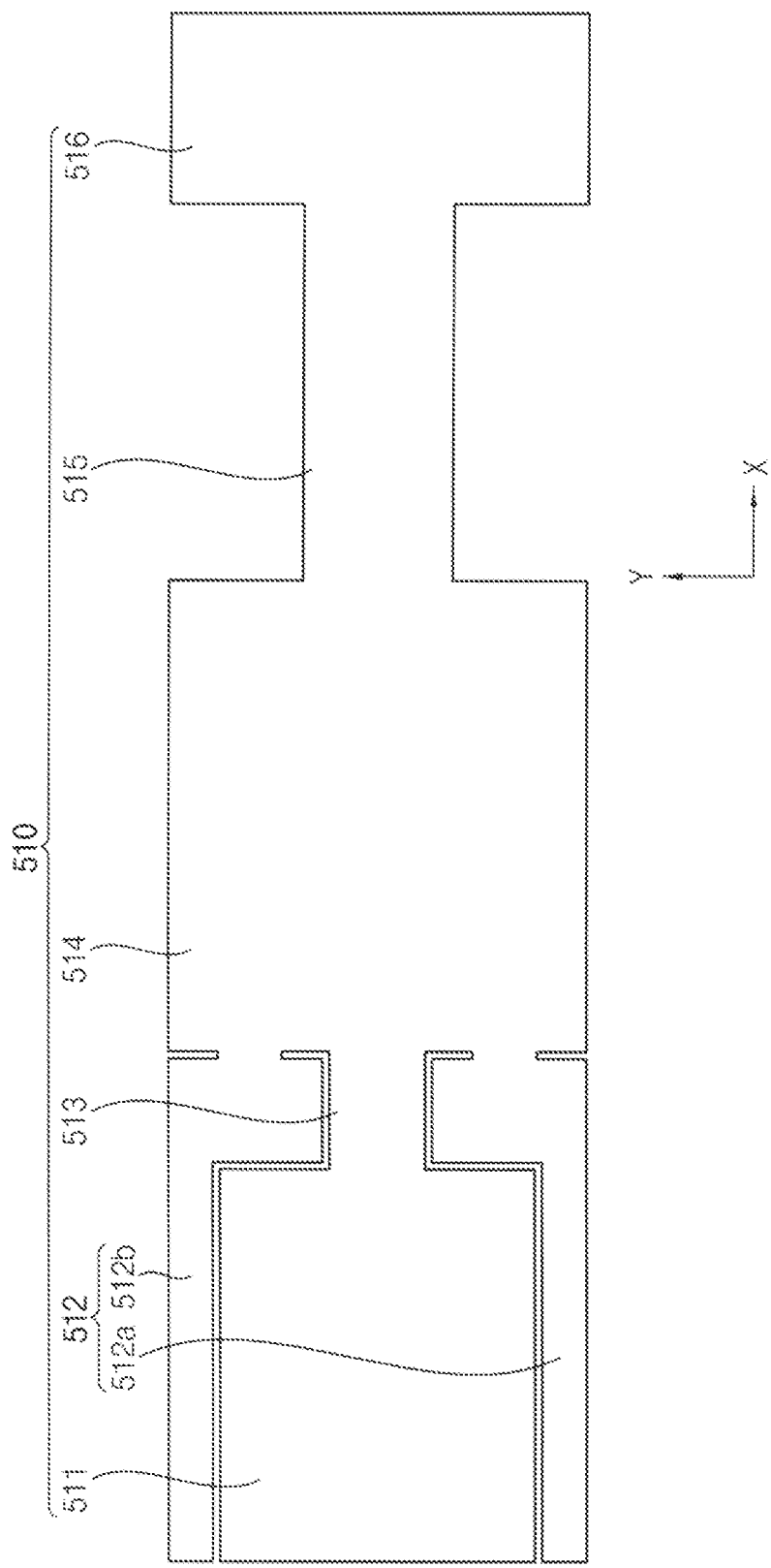

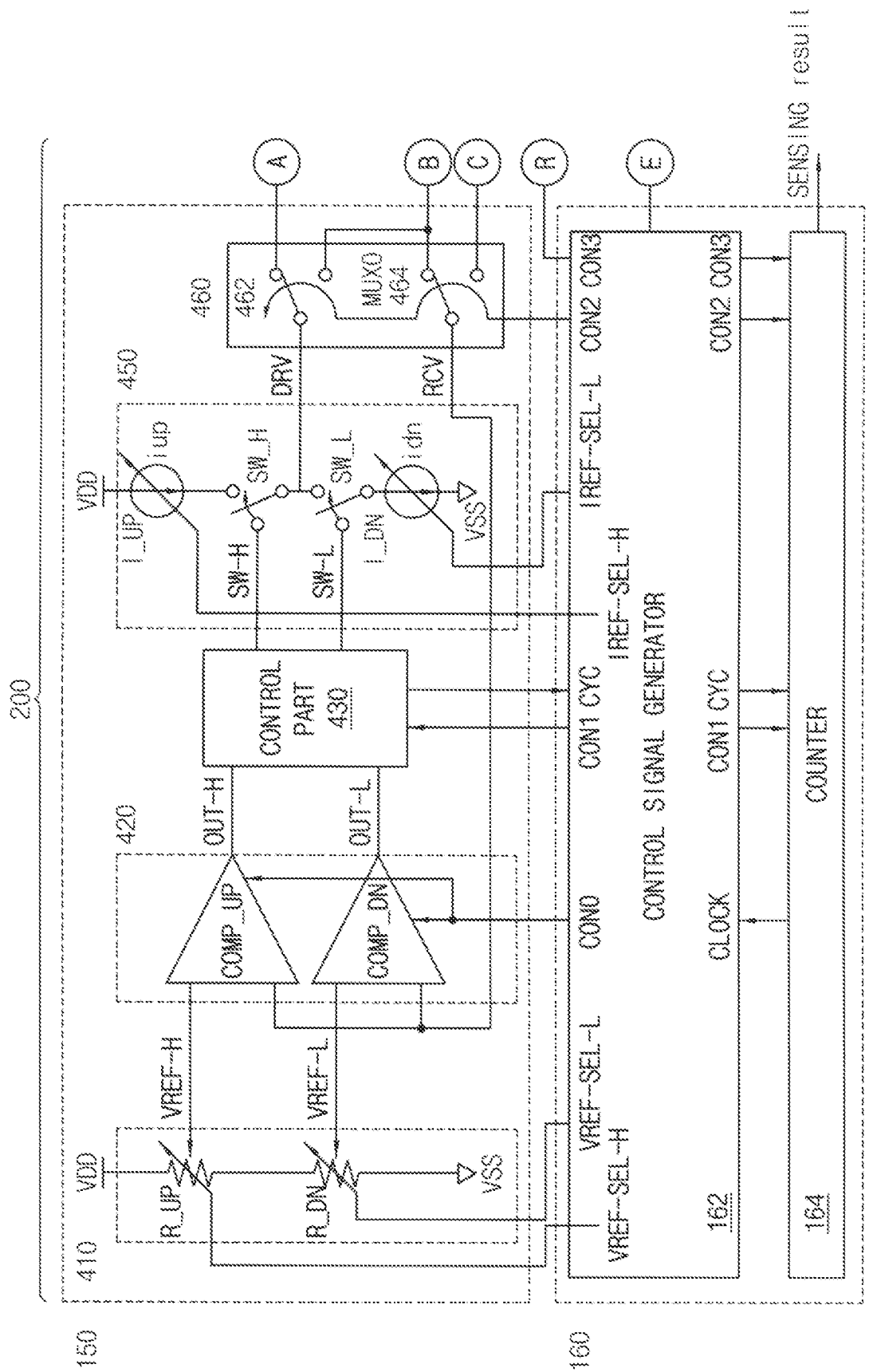

FIG. 11

| STAGE | INPUT SIGNAL | | | OUTPUT SIGNAL | | | | DESCRIPTION |
|---|---|---|---|---|---|---|---|---|
| | CON1 | OUT-H | OUT-L | SW-H | SW-L | DRV | CYC | |
| 1 | 0 | L | L | OFF | ON | L | L | INITIAL STATE |
| 2 | 1 | L | L | ON | OFF | L→H | L | INITIAL DRV RISING START |
| 3 | 1 | L | H | ON | OFF | L→H | L | SENSING-(RISING SIGNAL) |
| 4 | 1 | H | H | OFF | ON | H→L | H | RISING EDGE PEAK EDTECTION |
| 5 | 1 | L | H | OFF | ON | H→L | H | SENSING-(FALLING SIGNAL) |
| 6 | 1 | L | L | ON | OFF | L→H | L | FALLING EDGE PEAK EDTECTION |

FINGERPRINT SENSOR MODULE AND FINGERPRINT RECOGNITION APPARATUS HAVING SAME

CROSS-REFERENCE TO RELATED APPLICATIONS

This application is a U.S. National Phase of International Application Number PCT/KR2018/000378, filed Jan. 8, 2018, and claims priority under 35 U.S.C. § 119 to Korean Patent Application No. 10-2017-0048663, filed on Apr. 14, 2017 in the Korean Intellectual Property Office (KIPO), the contents of which are herein incorporated by reference in their entirety.

BACKGROUND OF THE INVENTION

Technical Field

Exemplary embodiments of the present invention relate to a fingerprint sensor module and a fingerprint recognition device having the fingerprint sensor module. More particularly, exemplary embodiments of the present invention relate to a fingerprint sensor module constructed by forming a TFT array on a thin film using a process for manufacturing a flexible display and a fingerprint recognition device having the fingerprint sensor module.

Discussion of the Related Art

With the development of computer technology, various computer-based systems have been developed for various purposes such as a notebook computer, a tablet PC, a smart phone, a personal digital assistant, an automatic teller machine, and a search guide system. Because these systems typically store a large amount of confidential data such as business information or business secrets, as well as personal information related to personal privacy, there is a need to enhance security to protect these data.

In order to enhance security, a fingerprint sensor capable of enhancing security by registering or authenticating a system using a fingerprint of a finger has been known.

The fingerprint sensor is a sensor for detecting a human fingerprint, and is largely divided into an optical fingerprint sensor and a capacitive fingerprint sensor.

The optical fingerprint sensor uses a principle of irradiating a light source such as a light emitting diode (LED) or the like and detecting light reflected by ridges of a fingerprint through a CMOS image sensor. The optical fingerprint sensor has a limitation in reducing the size of the optical fingerprint sensor because it has to scan using LEDs. Also, since the light source itself is expensive, the manufacturing cost of the optical fingerprint sensor increases.

The capacitance type fingerprint sensor uses a difference in the amount of electricity charged between a ridge and a valley in contact with the fingerprint sensor. A typical capacitive fingerprint sensor is configured in the form of an assembly in combination with a specific push button and includes a silicon wafer printed circuit for measuring the capacitance between the capacitive plate and the user's fingerprint (ridge and valley). Since the ridges and valleys of the fingerprints are very small in size from about 300 μm to 500 μm, the capacitive fingerprint sensor requires a high-resolution sensor array and an integrated chip (IC) for fingerprint recognition processing. To this end, a silicon wafer capable of integrally forming a sensor array and an IC is used.

In recent, a semiconductor-based fingerprint sensor has been used in a smartphone, resulting in a huge demand for silicon wafers, and the individual cost is also very high.

Moreover, a manufacturing process of modularizing the semiconductor-based fingerprint recognition sensor is also very complicated, so there is a limit in reducing the manufacturing cost.

SUMMARY

Exemplary embodiments of the present invention provide a fingerprint sensor module constructed by forming a TFT array on a thin film using a process for manufacturing a flexible display.

Exemplary embodiments of the present invention also provide a fingerprint recognition device having the above-mentioned fingerprint sensor module.

According to one aspect of the present invention, a fingerprint sensor module includes a base film, a thin-film transistor (TFT) sensor array, a plurality of first signal lines, an external component and a plurality of second signal lines. The base film includes a fingerprint sensing area, a wing area surrounding the fingerprint sensing area, a first signal connecting area adjacent to the fingerprint sensing area, a component mounting area adjacent to the first signal connecting area, and a second signal connecting area adjacent to the component mounting area. The TFT sensor array is formed in the fingerprint sensing area. The first signal lines are formed in the first signal connecting area to have one end connected to the TFT sensor array. The external component is mounted on the component mounting area to have one end connected to each of the first signal lines. The second signal lines are formed in the second signal connecting area to have one end connected to the external component.

In an exemplary embodiment, the base film may include a first conductive pattern formed on a portion area of the wing area for connection of a shield signal or a control signal.

In an exemplary embodiment, a cut portion defined by a cutting line and a connection portion adjacent to the cut portion may be formed in the wing area and the component mounting area which are adjacent to each other. A first wiring connected to the first conductive pattern may extend to the component mounting area via the connection portion.

In an exemplary embodiment, the base film may further include a second conductive pattern formed on another portion area of the wing area for connection of a shield signal to a lower portion of an outer metal ring.

In an exemplary embodiment, a cut portion defined by a cutting line and a connection portion adjacent to the cut portion may be formed in the wing area and the component mounting area which are adjacent to each other. In this case, a second wiring connected to the second conductive pattern may extend to the component mounting area via the connection portion.

In an exemplary embodiment, the base film may further include a connecting area adjacent to the second signal connecting area.

In an exemplary embodiment, the fingerprint sensor module may further include a connector portion disposed in the connecting area.

In an exemplary embodiment, the TFT sensor array may include a plurality of gate lines, a plurality of source lines, a plurality of TFTs connected to gate lines and source lines, and a plurality of fingerprint recognition patterns connected to the TFTs, respectively.

In an exemplary embodiment, the fingerprint sensor module may further include a plurality of gate lines, a plurality of source lines, and a plurality of TFTs connected to the gate line and the source line. In this case, a drain electrode of each of the TFTs is extended to define a fingerprint recognition pattern.

In an exemplary embodiment, the fingerprint sensor module may further include a gate driver, an upper switch and a lower switch. The gate driver sequentially provides a gate signal to the TFT sensor array. The upper switch is connected to a first side of the TFT sensor array to switch an output path of a driving signal for fingerprint recognition and a sensing signal according to fingerprint recognition. The lower switch is connected to a second side of the TFT sensor array to switch an output path of a drive signal for fingerprint recognition and a sensing signal according to the fingerprint recognition.

In an exemplary embodiment, the gate driver, the upper switch and the lower switch may be formed in the fingerprint sensing area.

In an exemplary embodiment, during a first time, the upper switch may provide a drive signal for fingerprint recognition provided from an outside to a first end of the TFT sensor array, and the lower switch may provide a sensing signal according to the fingerprint recognition received through a second end of the TFT sensor array to the outside. During a second time, the lower switch may provide a drive signal for fingerprint recognition provided from an outside to the second end of the TFT sensor array, and the upper switch may provide a sensing signal according to the fingerprint recognition received through the first end of the TFT sensor array to the outside.

In an exemplary embodiment, the fingerprint sensor module may further include a coating layer covering the first signal lines and the second signal lines.

According to another aspect of the present invention, a fingerprint recognition device includes a fingerprint sensor module, a first reinforcing plate, a second reinforcing plate and a metal ring. The fingerprint sensor module includes a base film having a fingerprint sensing area, a wing area surrounding the fingerprint sensing area, a first signal connecting area adjacent to the fingerprint sensing area, a component mounting area adjacent to the first signal connecting area, and a second signal connecting area adjacent to the component mounting area and bent in a U-shape. The first reinforcing plate is disposed between the component mounting area and the fingerprint sensing area bent in a U-shape to be faced to each other. The second reinforcing plate has a size corresponding to the component mounting area to support the fingerprint sensor module. The metal ring has a size corresponding to the component mounting area to press the fingerprint sensor module and expose a TFT sensor array formed in the fingerprint sensing area.

In an exemplary embodiment, the fingerprint recognition device may further include a space supplement film disposed below the first reinforcing plate corresponding to a rear surface of the component mounting area.

In an exemplary embodiment, the base film may further include a connecting area adjacent to the second signal connecting area. In this case, the fingerprint sensor module may further include a connector portion disposed in the connecting area.

In an exemplary embodiment, the fingerprint recognition device may further include a third reinforcing plate disposed on an opposite side of the connection portion in which the connector portion is formed for mechanical stability required for connector contact.

In an exemplary embodiment, in order to prevent damage to the TFT sensor array and peripheral circuit due to scratches in use when the TFT sensor array is used as a contact surface for fingerprint recognition, the fingerprint sensor module may further include an anti-damage layer having non-conductive characteristics to be formed on the TFT sensor array.

In an exemplary embodiment, a shield electrode layer may be formed on a rear surface of the first reinforcing plate, and a first conductive pattern forming an electrical contact with the shield electrode may be formed in the wing area where the first reinforcing plate overlaps.

In an exemplary embodiment, a second conductive pattern for electrical contact with the metal ring may be formed on the wing area.

According to another aspect of the present invention, a fingerprint recognition device includes a fingerprint sensor module, a first reinforcing plate, a first supporting plate, a second supporting plate and a metal ring. The fingerprint sensor module includes a base film having a fingerprint sensing area, a wing area surrounding the fingerprint sensing area, a first signal connecting area adjacent to the fingerprint sensing area, a component mounting area adjacent to the first signal connecting area, and a second signal connecting area adjacent to the component mounting area and bent in a stepped shape. The first reinforcing plate is disposed below the fingerprint sensing area. The first supporting plate is disposed below the component mounting area. The second supporting plate is disposed below the fingerprint sensing area. The metal ring has a size to cover the fingerprint sensing area to be disposed on the fingerprint sensing area to expose a TFT sensor array formed in the fingerprint sensing area.

In an exemplary embodiment, the base film may further include a connecting area adjacent to the second signal connecting area, and the fingerprint sensor module fingerprint sensor module may further include a connector portion disposed in the connecting area.

In an exemplary embodiment, the fingerprint recognition device may further include a third supporting plate disposed on the opposite side of the connection portion in which the connector portion is formed for mechanical stability and mechanical stability required for connector contact.

In an exemplary embodiment, in order to prevent damage to the TFT sensor array and peripheral circuitry due to scratches in use when the TFT sensor array is used as a contact surface for fingerprint recognition, the fingerprint sensor module may further include an anti-damage layer formed on the TFT sensor array with non-conductive characteristics.

In an exemplary embodiment, in order to express the pattern, color, gloss and texture to match the design concept of the module in use when the TFT sensor array is used as a contact surface for fingerprint recognition, the fingerprint sensor module may further include a design print layer formed on the TFT sensor array with a non-conductive property.

In an exemplary embodiment, a shield electrode layer may be formed on the rear surface of the first reinforcing plate, and a first conductive pattern may be formed on the wing area where the first reinforcing plate is overlapped and the electrical contact is formed on the shield electrode layer.

In an exemplary embodiment, the wing area may be formed with a second conductive pattern for electrical contact with the metal ring.

According to the fingerprint sensor module and the fingerprint recognition device having the fingerprint sensor module, by manufacturing the capacitive fingerprint recognition sensors using a technology for manufacturing a TFT sensor array based on LTPS (Low-Temperature Poly Silicon) used for manufacturing a liquid crystal display (LCD) and a technology for manufacturing a TFT sensor array based on a flexible film used for manufacturing a flexible display, it is possible to solve a shortage of silicon wafers generated when a fingerprint recognition sensor is manufactured through a silicon wafer-based TFT sensor array.

BRIEF DESCRIPTION OF THE DRAWINGS

The above and other features and aspects of the present invention will become more apparent by describing in detailed exemplary embodiments thereof with reference to the accompanying drawings, in which:

FIG. 1B is a rear view schematically explaining the fingerprint sensor module shown in FIG. 1A;

FIG. 9A and FIG. 9B are block diagrams schematically explaining the fingerprint recognition device shown in FIG. 1A.

FIG. 11 is a table schematically explaining input and output signals of a control unit 430 shown in FIG. 9A and FIG. 9B;

DETAILED DESCRIPTION OF THE INVENTION

Figure 1A:
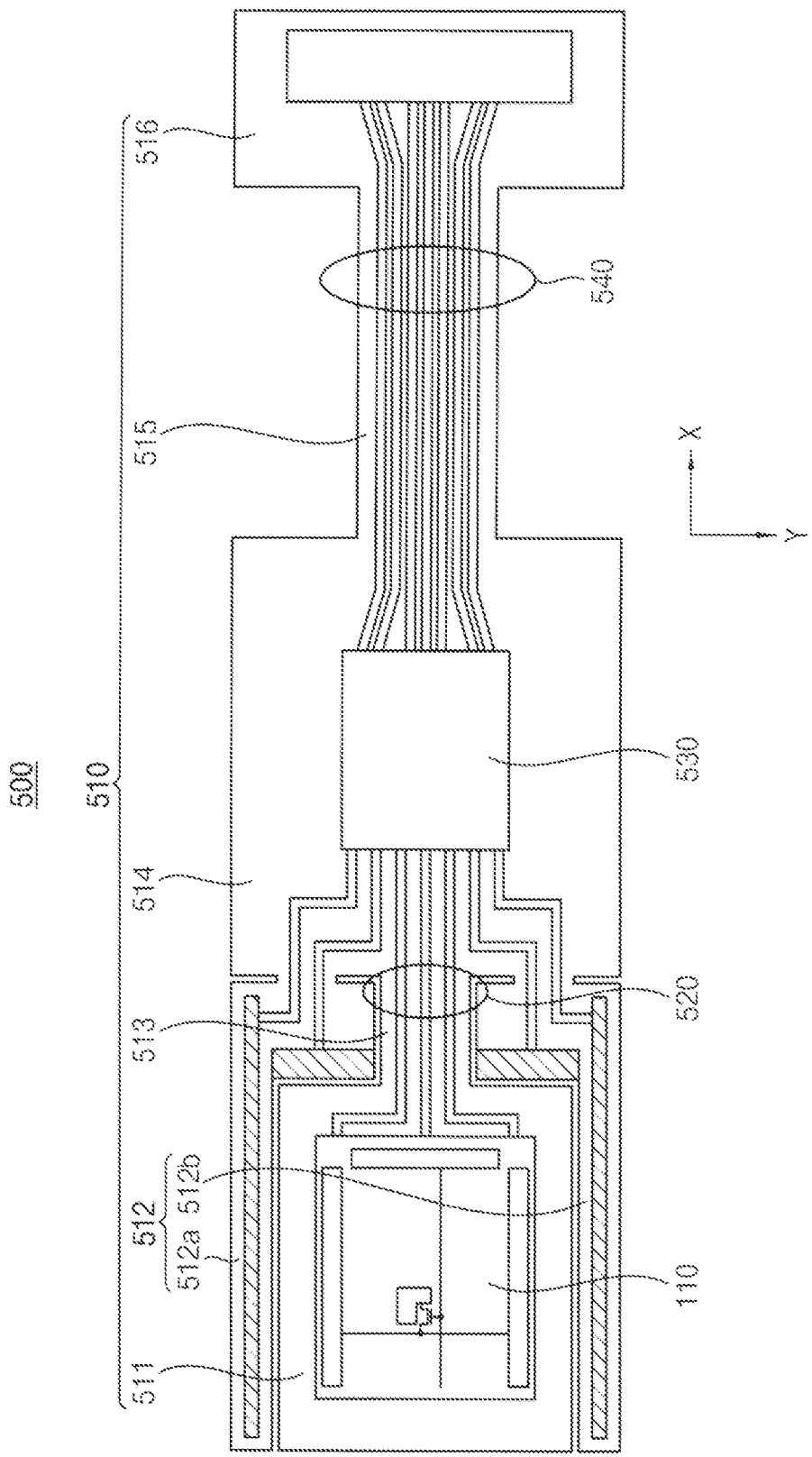
FIG. 1A is a plan view schematically explaining a fingerprint sensor module according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1A is a plan view schematically explaining a fingerprint sensor module 500 according to an exemplary embodiment of the present invention, and FIG. 1B is a rear view schematically explaining the fingerprint sensor module 500 shown in FIG. 1A.

Referring to FIG. 1A and FIG. 1B, the fingerprint sensor module 500 according to an exemplary embodiment of the present invention includes a base film 510, a thin-film transistor (TFT) sensor array 110, a plurality of first signal lines 520, an external component 530 and a plurality of signal lines 540.

The base film 510 has a fingerprint sensing area 511, a wing area 512 surrounding the fingerprint sensing area 511, a first signal connecting area 513 adjacent to the fingerprint sensing area 511, a component mounting area 514 adjacent to the first signal connecting area 513, a second signal connecting area 515 adjacent to the component mounting area 514, and a connecting area 516 adjacent to the second signal connecting area 515.

The wing area 512 has a shape surrounding the fingerprint sensing area 511. The wing area 512 and fingerprint sensing area 511 may be separated by a cutting line. In FIG. 1, when viewed in plan, a first wing portion 512a is disposed on an upper side of the fingerprint sensing area 511, and a second wing portion 512b is disposed on a lower side of the fingerprint sensing area 511. The first wing portion 512a has a reverse L-shape and the second wing portion 512b has an L-shape.

The first signal connecting area 513 is adjacent to the fingerprint sensing area 511. The first signal connecting area 513 may extend in a first direction. The width of the first signal connecting area 513 may be narrower than the width of the fingerprint sensing area 511. In the present exemplary embodiment, it is shown that the fingerprint sensor module 500 is disposed on the XY-plane and the first signal connecting area 513 is extended along the X-axis.

The component mounting area 514 is adjacent to the first signal connecting area 513. The component mounting area 514 extends in the first direction in the first signal connecting region 513. The width of the component mounting area 514 may be wider than the width of the fingerprint sensing area 511. Electrodes and wiring are formed in the component mounting region 514. Passive elements such as ROIC (Read Out IC) for reading the change amount of the electrostatic touch signal for fingerprint recognition and resistors and capacitors necessary for ROIC operation may be mounted on the component mounting area 514 through the TFT sensor array 110. As the mounting method, various methods such as ACF bonding, wire bonding, gold bump, and SMT may be used.

The second signal connecting area 515 is adjacent to the component mounting area 514. The second signal connecting area 515 may extend in the first direction. The width of the second signal connecting area 515 may be narrower than that of the component mounting area 514. The second signal connecting area 515 may be formed to have a width smaller than that of the component mounting area 514.

The connecting area 516 may extend in the first direction from the second signal connecting area 515. The width of the connecting area 516 may be wider than that of the second signal connecting area 515.

The TFT sensor array 110 is formed in the fingerprint sensing area 511. A description for the TFT sensor array 110 will be described later.

The external component 530 includes the ROIC and is mounted on the component mounting area 514. The external component 530 may further include one or more passive components such as a capacitor, a resistor, and the like.

A connector portion (not shown) is disposed in the connecting area 516. For one example, the connector portion may be formed in a socket type. For another example, the connector portion may be formed in a pad type having an extended signal line.

The first signal lines 520 are formed in the first signal connecting area 513. The first signal lines 520 play a role as signal paths through which signals between the TFT sensors and the external component 530 are transmitted and received.

The second signal lines 540 are formed in the second signal connecting area 515. The second signal lines 540 play a role as signal paths through which signals between the external component 530 and the connector unit are transmitted and received.

The fingerprint sensor module 500 according to the present exemplary embodiment is manufactured through a low-temperature polysilicon (LTPS) process. Typically, the LTPS process is performed at a process temperature of about 450 degrees Celsius or less. When the base film 510 according to the present exemplary embodiment is formed of polyimide, it may be formed at a process temperature of about 380 degrees Celsius.

Figure 2:
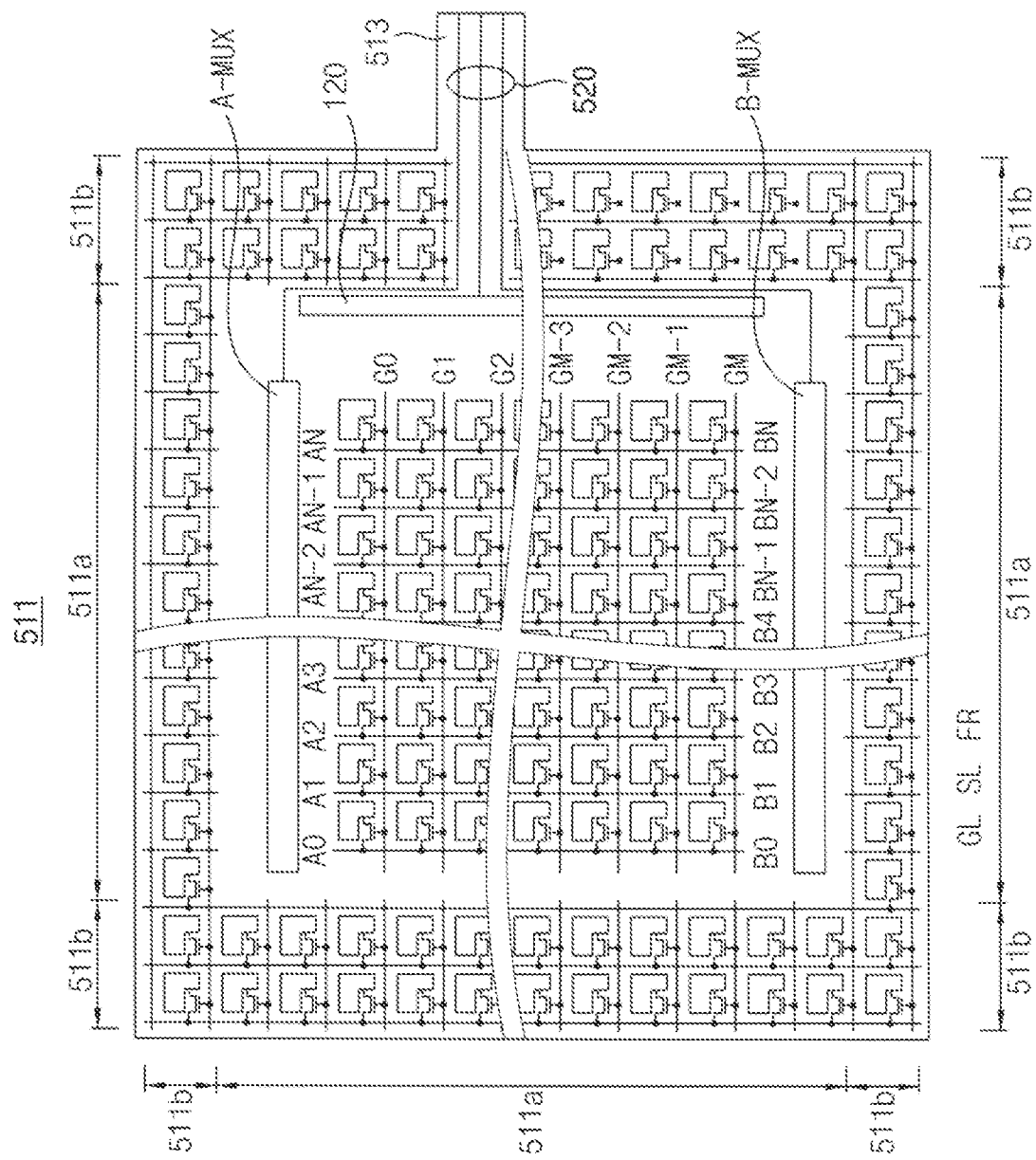
FIG. 2 is a plan view schematically explaining the fingerprint sensing area and the first signal connecting area shown in FIG. 1A.

FIG. 2 is a plan view schematically explaining the fingerprint sensing area 511 and the first signal connecting area 513 shown in FIG. 1A.

Referring to FIG. 1A and FIG. 2, the fingerprint sensing area 511 includes a TFT sensor area 511a and a TFT dummy area 511b surrounding the TFT sensor area 511a. In the fingerprint sensing area 511, a plurality of gate lines GL, a plurality of source lines SL and a plurality of TFTs are disposed thereon. The division between the TFT sensor area 511a and the TFT dummy area 511b may be performed by omitting the gate line GL and omitting the source line SL. In the present exemplary embodiment, the TFTs arranged in the TFT sensor area 511a are defined as a TFT sensor array 110, and the TFTs arranged in the TFT dummy area 511b are defined as a TFT dummy array. In FIG. 2, the TFTs are arranged in the TFT dummy area 511b. However, the TFTs may be omitted in the TFT dummy area 511b.

A gate driver 120, an upper switch A-MUX, a lower switch B-MUX, and a TFT sensor array 110 are disposed on the TFT sensor area 511a. The gate driver 120, the upper switch A-MUX, and the lower switch B-MUX may be manufactured in the process of forming the TFT sensor array 110.

The gate driver 120 is disposed in a right area of the TFT sensor array 110 to provide gate signals for fingerprint recognition to the TFT sensor array 110.

The upper switch A-MUX is disposed in an upper area of the TFT sensor array 110 to provide driving signals to the TFT sensor array 110 for a first time period and receive the sensing signals from the TFT sensor array 110 for the second time period.

The lower switch B-MUX is disposed in a lower area of the TFT sensor array 110 to receive sensing signals from the TFT sensor array 110 for a first time period and provide drive signals to the TFT sensor array 110 for a second time period.

The TFT sensor array 110 includes a plurality of gate lines GL, a plurality of source lines SL, a plurality of TFTs connected to the gate line GL and the source line SL, and a fingerprint recognition pattern FR connected to each of the TFTs.

Each of the gate lines GL applies gate signals provided from the gate driver 120 to the gate electrodes of the TFTs.

A first side of each of the source lines SL is connected to the upper switch A-MUX, and a second side of each of the source lines SL is connected to the lower switch B-MUX. When a driving signal is provided from the upper switch A-MUX, the first side of each of the source lines SL applies a driving signal to each of the TFTs, and the second side of each of the source lines SL deliveries a sensing signal sensed through the TFTs to the lower switch B-MUX. On the other hand, when a driving signal is provided from the lower switch B-MUX, the second side of each of the source lines SL applies a driving signal to each of the TFTs, and the first side of each of the source lines SL deliveries a sensing signal sensed through TFTs to the upper switch A-MUX.

Each of the TFTs includes a gate electrode connected to the gate line GL, a sensing electrode connected to the source line SL, and a drain electrode connected to the fingerprint recognition pattern FR.

The fingerprint recognition pattern FR is connected to the drain electrode of the TFT to provide a capacitance value according to a contact of the finger ridges or valleys to the source line SL through the TFT. For one example, the drain electrode of the TFT extends to define the fingerprint recognition pattern FR. For another example, a transparent electrode such as ITO is separately formed to define the fingerprint recognition pattern FR. When the drain electrode of the TFT extends to define the fingerprint recognition pattern FR, the drain electrode extends to a cell area.

Figure 3:
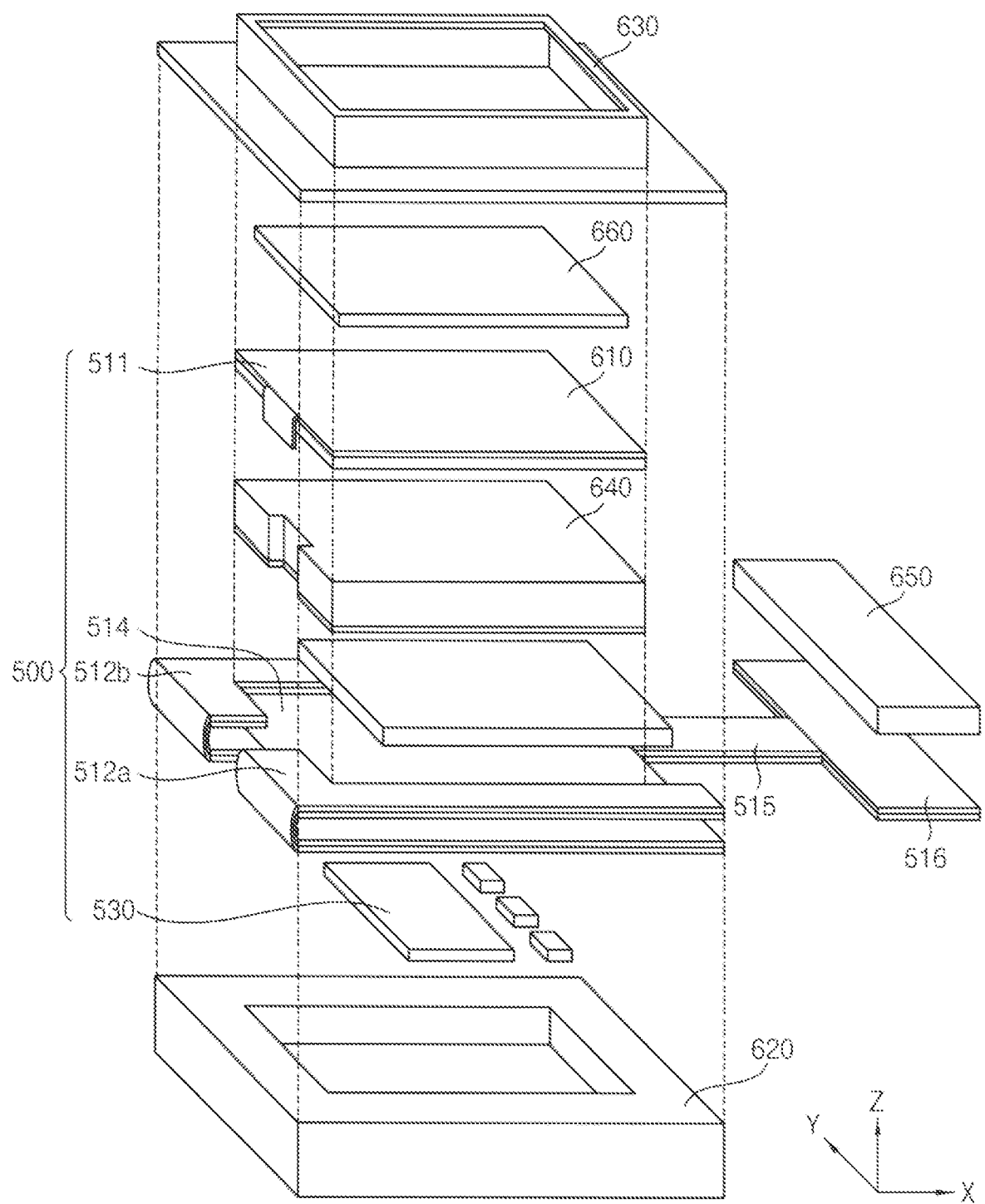
FIG. 3 is an exploded perspective view schematically explaining a fingerprint recognition device according to an exemplary embodiment of the present invention.

FIG. 3 is an exploded perspective view schematically explaining a fingerprint recognition device according to an exemplary embodiment of the present invention. In particular, a fingerprint recognition device including a fingerprint sensor module 500 that is bent in a U-shape is shown.

Referring to FIG. 1A, FIG. 1B, and FIG. 3, a fingerprint recognition device according to an exemplary embodiment of the present invention includes a fingerprint sensor module 500, a first reinforcing plate 610, a second reinforcing plate 620, a metal ring 630, a space supplement film 640 and a third reinforcing plate 650.

The fingerprint sensor module 500 is bent in a U-shape. Since the fingerprint sensor module 500 has been described with reference to FIG. 1A, FIG. 1B and FIG. 2, a detailed description thereof will be omitted. As the fingerprint sensor module 500 is bent in a U-shape, a rear surface of the component mounting area 514 and a rear surface of the fingerprint sensing area 511 may face each other. Moreover, as the fingerprint sensor module 500 is bent in U-shape, the rear surface of the component mounting area 514 and a rear surface of the wing area 512 may be in surface contact.

The first reinforcing plate 610 is disposed between the component mounting area 514 and the fingerprint sensing area 511 that are bent in a U shape and face each other.

The second reinforcing plate 620 has a size corresponding to the component mounting area 514 to support the fingerprint sensor module 500.

The metal ring 630 has a size corresponding to the component mounting area 514 to press the fingerprint sensor module 500 and expose the TFT sensors formed in the fingerprint sensing area 511.

The space supplement film 640 is disposed under the first reinforcing plate 610 corresponding to the rear surface of the component mounting area 514.

The third reinforcing plate 650 is disposed on an opposite side of the connection portion 516 formed with the connector portion for mechanical stability and mechanical stability required for connector contact.

In order to prevent damage to the TFT sensors and peripheral circuits due to scratches in use when TFT sensors formed on the fingerprint sensor module 500 are used as contact surfaces for fingerprint recognition, a damage prevention layer 660 may be further formed thereon. The damage prevention layer 660 may have a thickness of 300 μm or less and a nonconductive property.

On the other hand, in order to express the pattern, color, gloss and texture to suit the design concept of the module in use when TFT sensors formed on the fingerprint sensor module 500 are used as contact surfaces for fingerprint recognition, a design print layer may further be formed on the TFT sensors. The design print layer may have a thickness of 300 μm or less and nonconductive properties.

For example, the damage prevention layer 660 and the design print layer may be formed singly. Alternatively, the damage prevention layer 660 and the design print layer may be formed of two layers. In the case of two layers, the damage prevention layer 660 may be formed on the design print layer.

In the present exemplary embodiment, since the damage prevention layer 660 and/or the design print layer are formed on the TFT sensors, a glass cover window process may be omitted, and mass production is possible.

Figure 4:
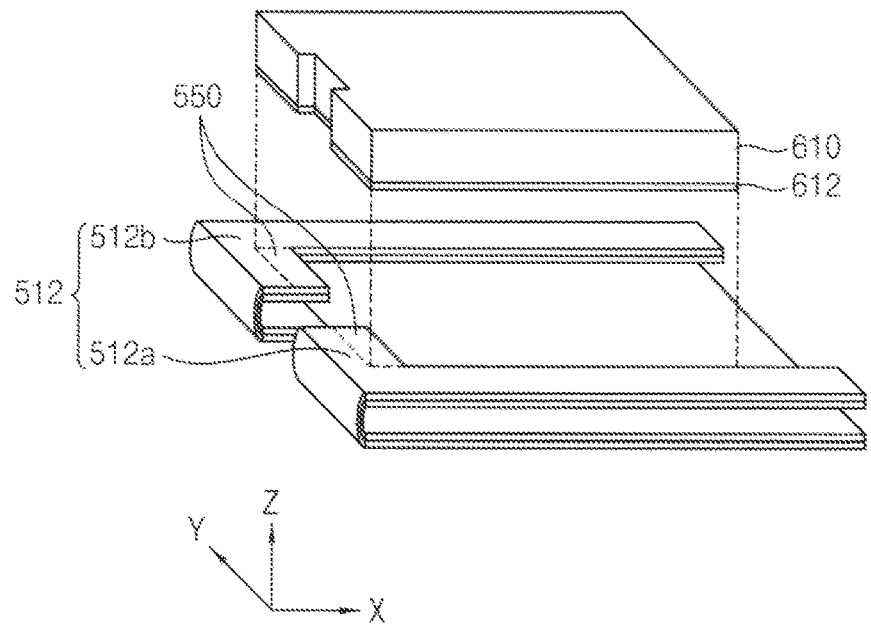
FIG. 4 is an exploded perspective view schematically explaining electrical contact between the first reinforcing plate and the fingerprint sensor module shown in FIG. 3.

FIG. 4 is an exploded perspective view schematically explaining electrical contact between the first reinforcing plate 610 and the fingerprint sensor module 500 shown in FIG. 3.

Referring to FIG. 1A, FIG. 1B, FIG. 3 and FIG. 4, a shield electrode layer 612 is formed on the bottom surface of the first reinforcing plate 610.

In the case of the fingerprint sensor module 500, the wing area 512 is bent along the +Z-axis and then disposed along the +X-axis direction with the component mounting area 514 contacting the XY-plane. As a result, a rear surface of the component mounting area 514 and a rear surface of the wing area 512 are in surface contact with each other. Although the rear surface of the component mounting area 514 and the rear surface of the wing area 512 are shown as being spaced apart from each other by a predetermined distance in FIG. 1A and FIG. 1B, they may be in surface contact by pressing with another object or by adhesive.

The wing area 512 has a shape surrounding a side surface of the first reinforcing plate 610 when viewed on a plane. That is, when viewing FIG. 4, the first wing portion 512a has a shape surrounding a lower side of the first reinforcing plate 610 and a lower left side of the first reinforcing plate 610. The second wing portion 512b has a shape surrounding an upper side of the first reinforcing plate 610 and an upper left side of the first reinforcing plate 610.

A first conductive pattern 550 is formed in a portion of the wing area 512 near the component mounting area 514 and is in contact with a bottom surface of the first reinforcing plate 610. That is, when viewing FIG. 4, the first conductive pattern 550 is formed in a portion of the first wing portion 512a overlapping with the lower left portion of the first reinforcing plate 610, and the first conductive pattern 550 is formed in a portion of the second wing portion 512b overlapping with an upper left side portion of the first wing portion 610. Therefore, the first conductive pattern 550 formed on each of the first wing portion 512a and the second wing portion 512b and the shield electrode layer 612 formed on a bottom surface of the first reinforcing plate 610 are in surface contact to be electrically connected to each other.

Figure 5:
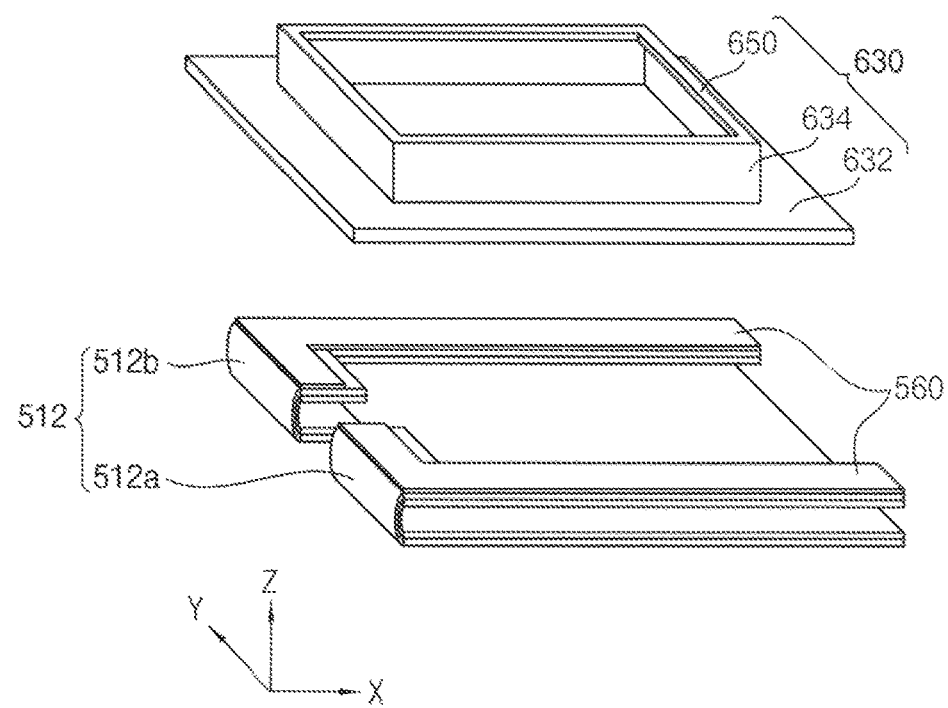
FIG. 5 is an exploded perspective view schematically explaining electrical contact between the metal ring and the fingerprint sensor module shown in FIG. 3.

FIG. 5 is an exploded perspective view schematically explaining electrical contact between the metal ring 630 and the fingerprint sensor module 500 shown in FIG. 3.

Referring to FIG. 1A, FIG. 1B, FIG. 3 and FIG. 5, the metal ring 630 has a rectangular frame shape defined by a rectangular frame 632, protruding walls 634 extending upward from the rectangular frame 632 and stepped portions 636 extended from the walls 634.

The rectangular frame 632 has a uniform width to be disposed on a plane parallel to the XY-plane. The widths of the four sides of the rectangular frame 632 may be equal to each other or may be different from each other. The width of the sides of the rectangular frame 632 may be equal to the width of the bending area of the fingerprint sensor module 500. The protruding walls 634 protrude from each of the inner sides of the rectangular frame 632 in the +Z axis direction. The stepped portions 636 extend inwardly at the ends of each of the protruding walls 634 vertically.

In the present exemplary embodiment, although it is shown that the metal ring 630 has a rectangular frame shape, the metal ring 630 may have various shapes such as a circular shape, an elliptical shape, a polygonal shape, and the like.

In the case of the fingerprint sensor module 500, the wing area 512 is bent in the +Z-axis and bent back in the +X-axis, and then arranged along the axial direction in a state in which the component mounting area 514 is in contact with the XY-plane. As a result, a rear surface of the component mounting area 514 and a rear surface of the wing area 512 are in surface contact with each other.

The wing area 512 is overlapped with an opposite side of the metal ring 630 when viewed in plan. The first wing portion 512a is overlapped with a first side of the rectangular frame 632 of the metal ring 630, and the second wing portion 512b is overlapped with a second side of the rectangular frame 632 of the metal ring 630. A second conductive pattern 560 is formed in an area where the first wing portion 512a or the second wing portion 512b overlapping with the opposite sides of the rectangular frame 632. Thus, the second conductive pattern 560 and the metal ring 630 are in surface contact with each other to be electrically connected to each other.

Additionally, the second conductive pattern 560 may extend to the first signal connecting area 513. Accordingly, the second conductive pattern 560 formed on the first wing portion 512a having an inverted-L-shape may have an inverted-L-shape, and the second conductive pattern 560 formed on the second wing portion 512b having an L-shape may have an L-shape.

Figure 6:
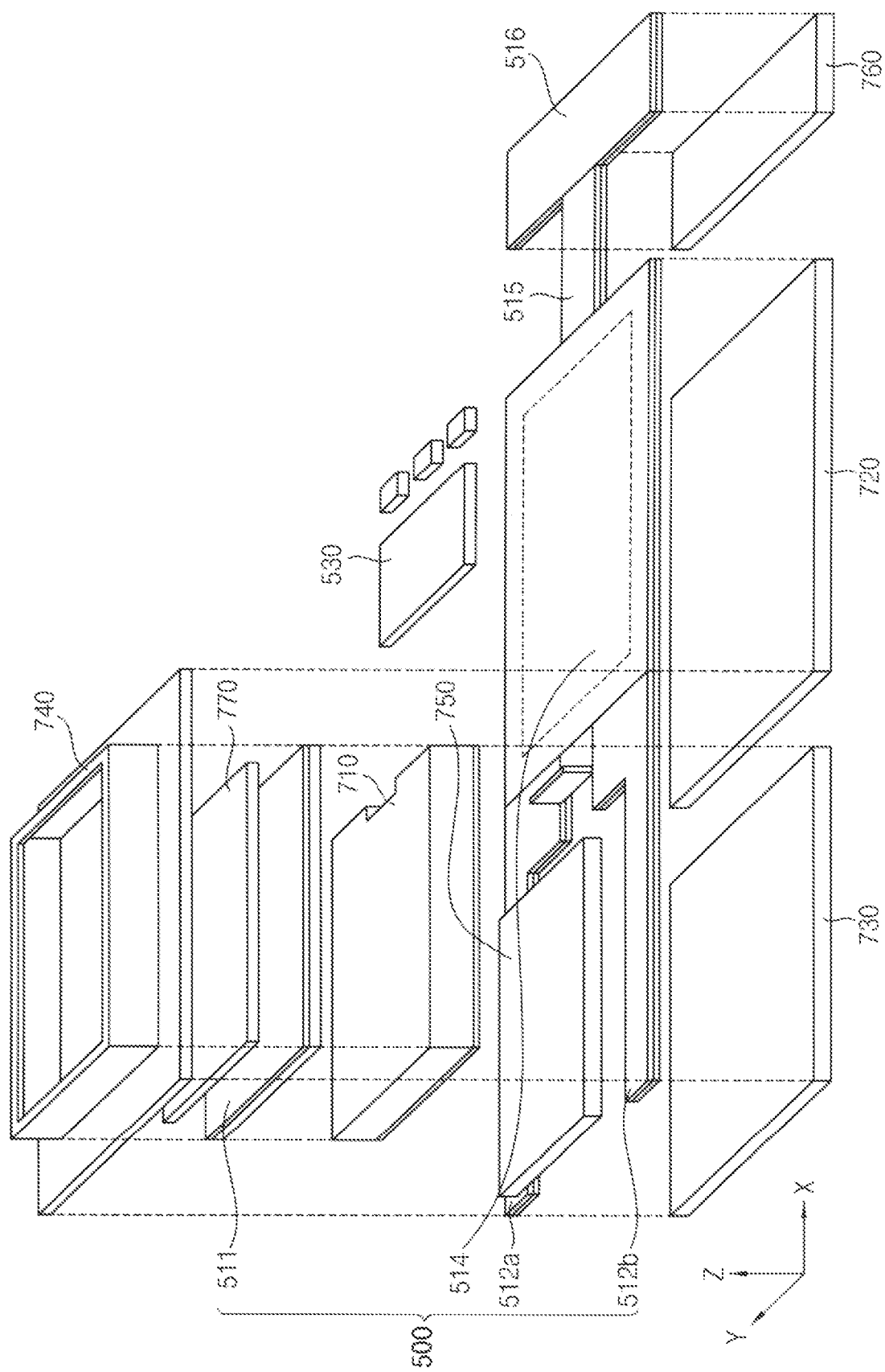
FIG. 6 is an exploded perspective view schematically explaining a fingerprint recognition device according to another exemplary embodiment of the present invention.

FIG. 6 is an exploded perspective view schematically explaining a fingerprint recognition device according to another exemplary embodiment of the present invention. Particularly, a fingerprint recognition device including a fingerprint sensor module 500 that is bent in a stepped shape is shown.

Referring to FIG. 1A, FIG. 1B and FIG. 6, the fingerprint recognition device according to another exemplary embodiment of the present invention includes a fingerprint sensor module 500, a first reinforcing plate 710, a first supporting plate 720, a second supporting plate 730, a metal ring 740, a space replenishment film 750 and a third supporting plate 760.

The fingerprint sensor module 500 is disposed on the XY-plane. That is, when viewing the fingerprint sensor module 500 in the Z-axis, the TFT sensors, the first signal lines, the external components and the second signal lines disposed on the base film are arranged to be exposed. Since the fingerprint sensor module 500 has been described with reference to FIG. 1A, FIG. 1B and FIG. 2, a detailed description thereof will be omitted. The fingerprint sensing area 511 is disposed on the first reinforcing plate 710, so that the fingerprint sensing area 511 is disposed at a higher position than the component mounting area 514. Therefore, the fingerprint sensor module 500 is bent in a stepped shape.

The first reinforcing plate 710 has a size corresponding to the fingerprint sensing area 511 to be disposed below the fingerprint sensing area 511. A length of the first signal connecting area 513 may vary according to a height of the first reinforcing plate 710.

The first supporting plate 720 has a size corresponding to the component mounting area 514 to be disposed under the component mounting area 514.

The second supporting plate 730 has a size corresponding to the fingerprint sensing area 511 to be disposed below the fingerprint sensing area 511.

The metal ring 740 has a size covering the fingerprint sensing area 511 to be disposed over the fingerprint sensing area 511, and exposes the TFT sensors formed in the fingerprint sensing area 511.

The third supporting plate 760 is disposed on an opposite side of the connection portion 516 formed with the connector portion for mechanical stability and mechanical stability required for connector contact.

In order to prevent damage to the TFT sensors and peripheral circuits due to scratches in use when TFT sensors formed on the fingerprint sensor module 500 are used as contact surfaces for fingerprint recognition, a damage prevention layer 770 may be further formed thereon. The damage prevention layer 770 may have a thickness of 300 μm or less and a nonconductive property.

On the other hand, in order to express the pattern, color, gloss and texture to suit the design concept of the module in use when TFT sensors formed on the fingerprint sensor module 500 are used as contact surfaces for fingerprint recognition, a design print layer may further be formed on the TFT sensors. The design print layer may have a thickness of about 300 μm or less and nonconductive properties.

For example, the damage prevention layer 770 and the design print layer may be formed singly. Alternatively, the damage prevention layer 770 and the design print layer may be formed of two layers. In the case of two layers, the damage prevention layer 770 may be formed on the design print layer.

In the present exemplary embodiment, since the damage prevention layer 770 and/or the design print layer are formed on the TFT sensors, a glass cover window process may be omitted, and mass production is possible.

Figure 7:
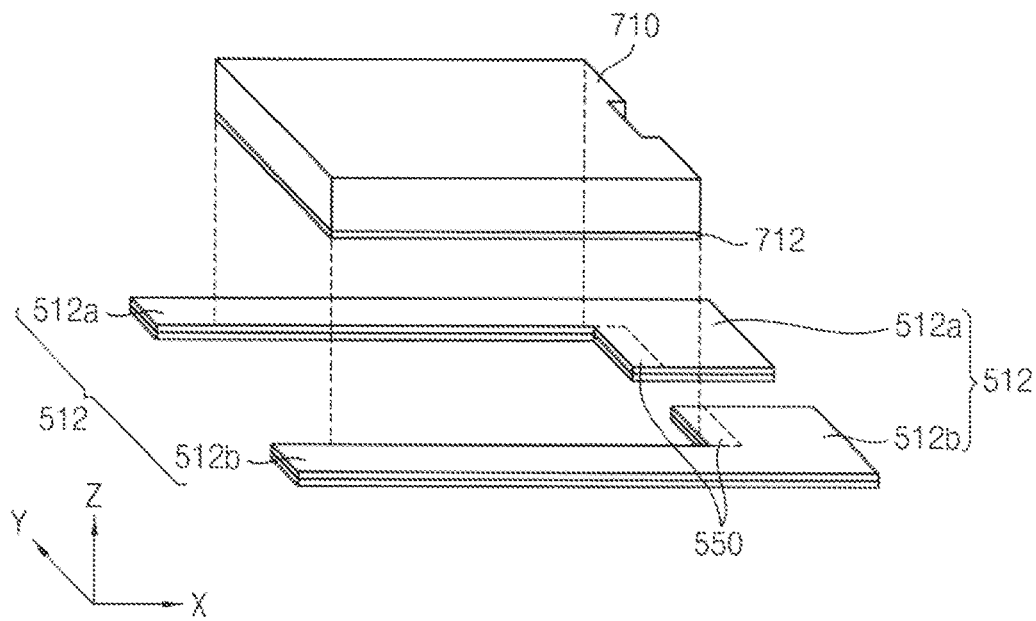
FIG. 7 is an exploded perspective view schematically explaining electrical contact between the first reinforcing plate and the fingerprint sensor module shown in FIG. 6.

FIG. 7 is an exploded perspective view schematically explaining electrical contact between the first reinforcing plate 710 and the fingerprint sensor module 500 shown in FIG. 6.

Referring to FIG. 1A, FIG. 1B, FIG. 6 and FIG. 7, a shield electrode layer 712 is formed on a bottom surface of the first reinforcing plate 710.

The wing area 512 provided in a base film of the fingerprint sensor module 500 has a shape that surrounds a side surface of the first reinforcing plate 710 when viewed from the plane. That is, when viewed from FIG. 7, the first wing portion 512a has a shape that surrounds a portion of the upper right side and the upper side of the first reinforcing plate 710. The second wing portion 512b has a shape that surrounds a lower side and a portion of a lower right side of the first reinforcing plate 710.

A first conductive pattern 550 is formed in a portion of the wing area 512 near the component mounting area 514 and is in contact with a bottom surface of the first reinforcing plate 710. That is, when viewing FIG. 7, a first conductive pattern 550 is formed in a portion of the first wing portion 512a overlapping with a portion of the upper lower side of the first reinforcing plate 710. In addition, the first conductive pattern 550 is formed in a portion of the second wing portion 512b overlapping with a portion of a lower right side of the first wing portion 710. Thus, the first conductive pattern 550 formed on each of the first wing portion 512a and the second wing portion 512b and the shield electrode layer 712 formed on a bottom surface of the first reinforcing plate 710 are in surface contact to be electrically connected to each other.

Figure 8:
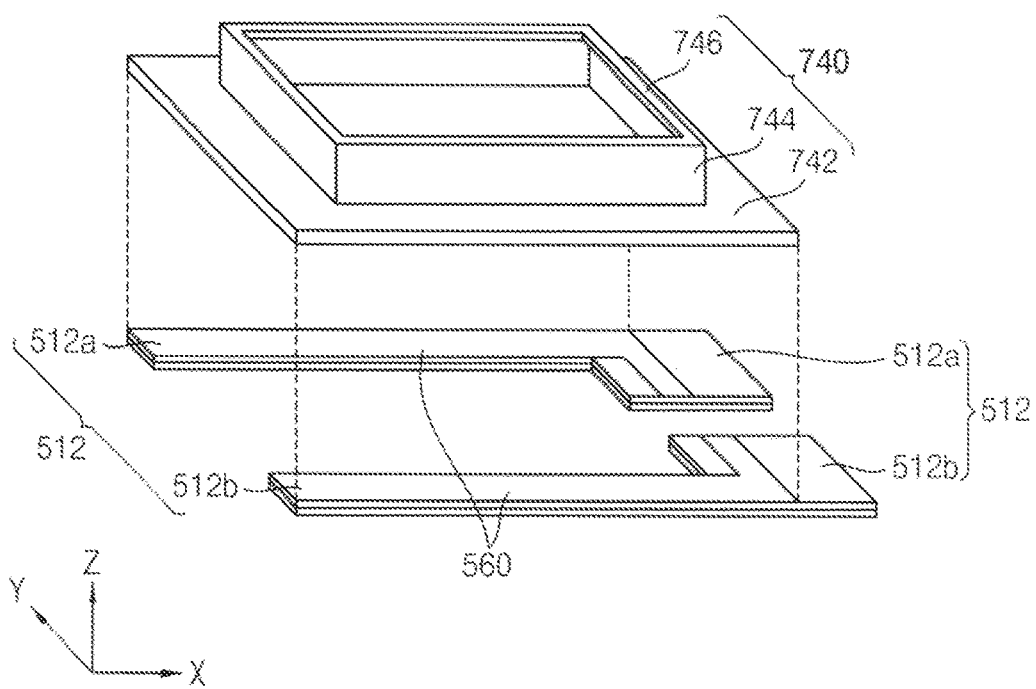
FIG. 8 is an exploded perspective view schematically explaining electrical contact between the metal ring and the fingerprint sensor module shown in FIG. 6.

FIG. 8 is an exploded perspective view schematically explaining electrical contact between the metal ring 740 and the fingerprint sensor module 500 shown in FIG. 6.

Referring to FIG. 1A, FIG. 1B, FIG. 6 and FIG. 8, a metal ring 740 has a rectangular frame shape defined by a rectangular frame 732, protruding walls 734 extending upward from the rectangular frame 732 and stepped portions 736 extended from the walls 734.

The rectangular frame 732 has a uniform width to be disposed on a plane parallel to the XY-plane. The widths of the four sides of the rectangular frame 732 may be equal to each other or may be different from each other. The width of the sides of the rectangular frame 732 may be equal to the width of the bending area of the fingerprint sensor module 500. The protruding walls 734 protrude from each of the inner sides of the rectangular frame 732 in the +Z axis direction. The stepped portions 736 extend inwardly at the ends of each of the protruding walls 734 vertically.

In the present exemplary embodiment, although it is shown that the metal ring 730 has a rectangular frame shape, the metal ring 730 may have various shapes such as a circular shape, an elliptical shape, a polygonal shape, and the like.

In the present exemplary embodiment, the fingerprint sensor module 500 is disposed on the XY-plane so that the TFT sensors, the first signal lines, the external components and the second signal lines disposed on a base film are exposed.

The wing area 512 extending in the component mounting area 514 is disposed along the −X-axis direction, after being bent along the +Z-axis direction and then bent along the −X-axis direction. Accordingly, a height of the component mounting area 514 and a height of the wing area 512 are different from each other. That is, there is a step between the wing area 512 and the component mounting area 514. The step may correspond to a height of the first reinforcing plate 710.

The wing area 512 is overlapped with an opposing side of the metal ring 740 when viewed in plan. The first wing portion 512a is overlapped with a first side of the rectangular frame 742 of the metal ring 740, and the second wing portion 512b is overlapped with a second side of the rectangular frame 742 of the metal ring 740. A second conductive pattern 560 is formed in an area where the first wing portion 512a or the second wing portion 512b overlapping with the opposite sides of the rectangular frame 742. Thus, the second conductive pattern 560 and the metal ring 740 are in surface contact with each other to be electrically connected to each other.

Additionally, the second conductive pattern 560 may extend to the first signal connecting area 513. Accordingly, the second conductive pattern 560 formed on the first wing portion 512a having an inverted-L-shape may have an inverted-L-shape, and the second conductive pattern 560 formed on the second wing portion 512b having an L-shape may have an L-shape.

Figure 9B:
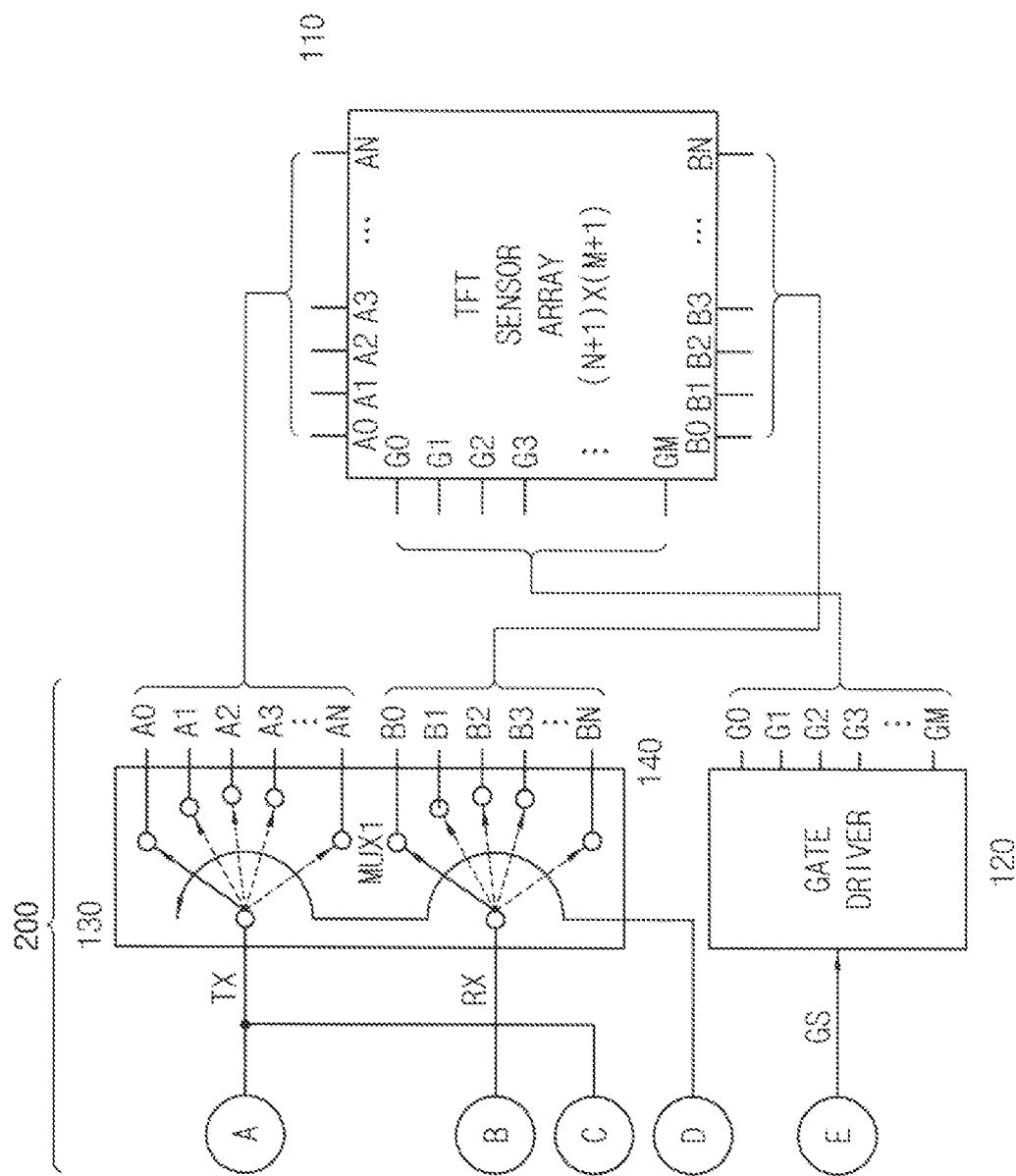
Figure 10A:
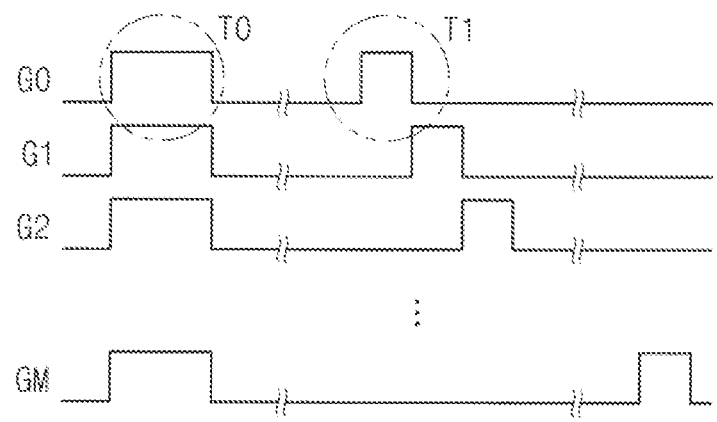
FIG. 10A is a waveform diagram schematically explaining gate signals in the fingerprint recognition device shown in FIG. 9A and FIG. 9B.
Figure 10B:
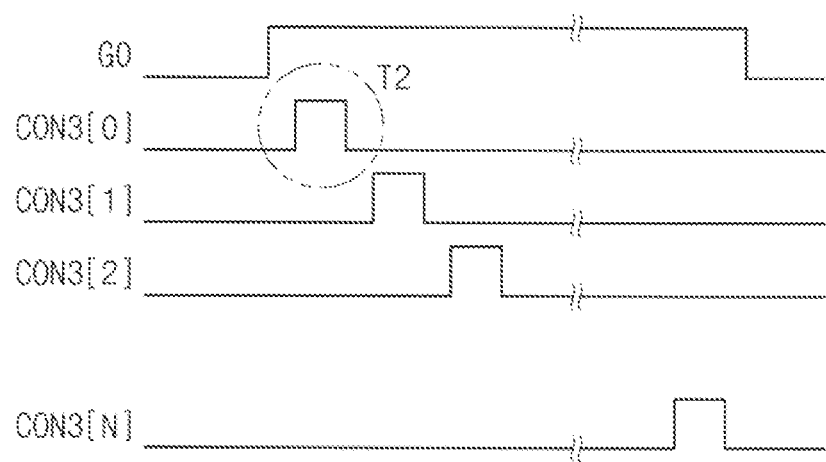
FIG. 10B is a waveform diagram schematically explaining a fourth control signal for sequentially sensing the sensing signals corresponding to the first gate signal.
Figure 10C:
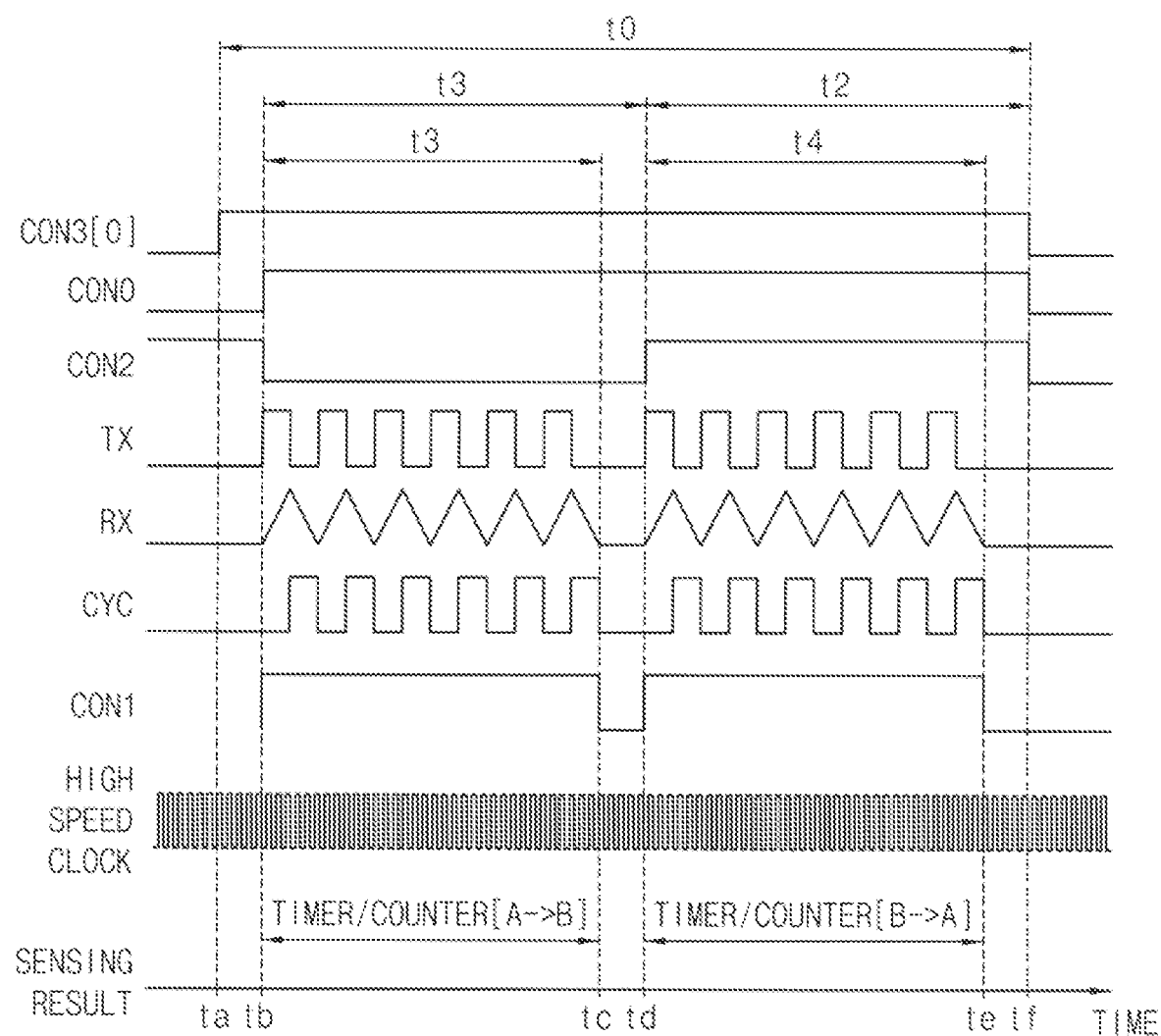
FIG. 10C is a waveform diagram schematically explaining signals corresponding to the fourth control signal for detecting a sensing signal in the first source line.

FIG. 9A and FIG. 9B are block diagrams schematically explaining the fingerprint recognition device shown in FIG. 1A. FIG. 10A is a waveform diagram schematically explaining gate signals in the fingerprint recognition device shown in FIG. 9A and FIG. 9B, FIG. 10B is a waveform diagram schematically explaining a fourth control signal for sequentially sensing the sensing signals corresponding to the first gate signal, and FIG. 10C is a waveform diagram schematically explaining signals corresponding to the fourth control signal CON3 for detecting a sensing signal in the first source line.

Referring to FIG. 9A to FIG. 10C, a fingerprint recognition device according to an exemplary embodiment of the present invention includes a TFT sensor array 110 and a capacitance measurement circuit 200. In the present exemplary embodiment, the TFT sensor array 110 may correspond to the TFT sensor array formed in the TFT sensor area described in FIG. 2, and the capacitance measurement circuit 200 may correspond to the gate driver, the upper switch A-MUX, the lower switch B-MUX and the external component that are formed in the TFT sensor area described in FIG. 2

The TFT sensor array 110 includes a plurality of gate lines GL, a plurality of source lines SL, a plurality of TFTs connected to the gate lines GL and the source lines SL, and a plurality of fingerprint recognition pattern connected to the TFTs.

The capacitance measuring circuit 200 includes a gate driving unit 120, an upper switch 130, a lower switch 140, a sensing driving unit 150 and a timing control unit 160. In the present exemplary embodiment, each of the gate driver 120, the upper switch 130 and the lower switch 140 may correspond to the gate driver, the upper switch A-MUX and the lower switch B-MUX described in FIG. 2. Moreover, the sensing driver 150 and the timing controller 160 may be mounted on the external component described in FIG. 1 to FIG. 8.

The gate driver 120 sequentially provides gate signals to the gate lines GL.

The upper switch 130 and the lower switch 140 select the source lines SL so that the driving signals TX are sequentially provided to the source lines SL. Moreover, the upper switch 130 and the lower switch 140 select the source lines SL so that the second signals RX are sequentially provided to the source lines SL.

For example, the upper switch 130 and the lower switch 140 may output the driving signal TX in the order of one end of the source lines SL, that is, A0, A1, A2, . . . , AN, and may sequentially receive the sensing signal RX in the same order as the other terminals of the source lines SL, that is, B0, B1, B2, . . . , BN, by setting the switching path. The upper switch 130 and the lower switch 140 may sequentially output the driving signals TX in the order of one end of the source lines SL, that is, AN, AN−1, . . . , A1, A0, and may sequentially receive the sensing signal RX in the order of the other ends of the source lines SL, that is, BN, BN−1, B1, . . . , B0, by setting the switching path.

The sensing driving unit 150 includes a reference voltage generator 410, a voltage comparison unit 420, a control unit 430, a charge/discharge circuit unit 450, and a transmission/reception switching unit 460. During a first time, the sensing driving unit 150 provides a driving signal TX for recognizing the fingerprint to a first end of each of the source lines SL, and receives a first direction sensing signal according to the fingerprint recognition through a second end of each of the source lines SL. During a second time, the sensing driving unit 150 provides the driving signal TX to the second end of each of the source lines SL, and receives a second direction sensing signal according to the fingerprint recognition through the first end of each of the source lines SL.

The sensing driving unit 150 is connected to a plurality of fingerprint recognition patterns to apply a constant current to each of the fingerprint recognition patterns. The sensing driving unit 150 measures the capacitances of the fingerprint recognition pattern by measuring the time required for discharging the capacitance of the capacitance generated by the ridge or the valley of the finger and the fingerprint recognition pattern to the reference voltage. Specifically, charge/discharge circuit unit 450 continuously performs charging/discharging of the constant cycle N times. When the capacitance is inputted from the fingerprint recognition pattern respectively connected to the upper switch 130 and the lower switch 140, a time difference is generated in the certain period, and the counter 164 measures the accumulated time difference during the N cycles so that it is determined whether the capacitance is inputted. When the capacitance is measured through the fingerprint recognition pattern as the number of charge/discharge increases, the time required for charge/discharge increases proportionally.

The reference voltage generating unit 410 includes a first resistor R_UP and a second resistor R_DN connected in series. The reference voltage generating unit 410 generates a first reference voltage VREF-H and a second reference voltage VREF-L and provides the first and second reference voltages VREF-H and VREF-L to the voltage comparison unit 20. In the present exemplary embodiment, the first resistor R_UP and the second resistor R_DN are variable resistors. The resistance value of the first and second variable resistor R_UP and R_DN may be changed by a program. Accordingly, the first reference voltage VREF-H and the second reference voltage VREF-L are also variable voltages.

When the noise of the power source applied to the capacitance measuring circuit 200 is high or the noise from the outside is large, the first reference voltage VREF-H and the second reference voltage VREF-L May be changed to a program so that a reference voltage that is not affected by noise can be set. In particular, as the area of the fingerprint recognition pattern formed to detect the capacitance is wider, the noise is much introduced due to the influence of the external environment, and the capacitance sensing characteristic is deteriorated. However, if the difference between the first reference voltage VREF-H and the second reference voltage VREF-L is controlled small, the noise characteristic can be further reduced. However, when the difference between the voltages of the first reference voltage VREF-H and the second reference voltage VREF-L is set small, the SNR (signal-to-noise ratio) of the result of capacitance measurement during the same time is improved. However, since a certain portion of the capacitance sensing signal is reduced, the first reference voltage VREF-H and the second reference voltage VREF-L are selected according to the application.

The voltage comparison unit 420 compares the voltages generated by the reference voltage generating unit 410 with the sensing voltages input from the fingerprint recognition pattern in response to a first control signal CON0 provided from an external device. For example, the voltage comparison unit 420 includes a first voltage comparator COMP_UP and a second voltage comparator COMP_DN. In the present exemplary embodiment, the first control signal CON0 enables or disables the first and second voltage comparators COMP_UP and COMP_DN. That is, the first control signal CON0 having the H level enables the first and second voltage comparators COMP_UP and COMP_DN, and the first control signal CON0 having the L level disables the first and second comparators COMP_UP and COMP_DN.

The first voltage comparator COMP_UP compares the first reference voltage VREF-H generated by the reference voltage generator 410 with a sensing voltage input from the fingerprint recognition pattern to output a first comparison signal OUT-H in response to the first control signal CON0 having the H level. The first comparison signal OUT-H is output to the predetermined H level when the voltage of the signal compared in the first voltage comparator COMP_UP is equal to or higher than the voltage of the first reference voltage VREF-H, and the first comparison signal OUT-H is output to the L level when the voltage of the signal compared in the voltage comparator COMP_UP is lower than the voltage of the first reference voltage VREF-H. When the first comparison signal OUT-H of H level is output, the charge control signal SW-H and the discharge control signal SW-L output from the control unit 430 are controlled so that the driving signal DRV is immediately changed from the H level to the L level within a predetermined delay time existing in the circuit during an operation period (that is, the second control signal CON1 is H).

The second voltage comparator COMP_DN compares the second reference voltage VREF-L generated by the reference voltage generator 410 with the sensing voltage input from the fingerprint recognition pattern to output a second comparison signal OUT-L in response to the first control signal CON0 having the H level. The second comparison signal OUT-L is output to the predetermined H level when the voltage of the signal compared in the second voltage comparator COMP_DN is equal to or higher than the voltage of the second reference voltage VREF-L, and the second comparison signal OUT-L is output to the L level when the voltage of the signal compared in the voltage comparator COMP_DN is lower than the voltage of the second reference voltage VREF-L. When the second comparison signal OUT-L of H level is output, the charge control signal SW-H and the discharge control signal SW-L output from the control unit 430 are controlled so that the driving signal DRV is immediately changed from the L level to the H level within a predetermined delay time existing in the circuit during an operation period (that is, the second control signal CON1 is H).

In the present exemplary embodiment, each of the first and second voltage comparators COMP_UP and COMP_DN may include a voltage comparator with hysteresis characteristics. The voltage comparators having hysteresis characteristics are also referred to as comparators having a Schmitt trigger. By using the voltage comparators, it is possible to prevent the comparator from operating too sensitively when the noise of the VDD supply voltage applied to the capacitance measurement circuit 200 or the noise of the GND level voltage is applied. Therefore, when a semiconductor developed on the basis of the present specification operates in an application circuit, it is possible to improve a signal-to-noise ratio (SNR) from noise due to a power supply.

The control unit 430 receives the first comparison signal OUT-H and the second comparison signal OUT_L, which are the output signals of the first voltage comparator COMP_UP and the second voltage comparator COMP_DN of the voltage comparison part 420 and a second control signal CON1 provided from an external device, and controls the operation of the charge/discharge circuit unit 450 and the operation of the timing control unit 160.

The control unit 430 operates as a table shown in FIG. 3 and generates a charge control signal SW-H, a discharge control signal SW-L and a CYC using the output value of the comparator and the control signal CON1.

FIG. 11 is a table schematically explaining input and output signals of a control unit 430 shown in FIG. 9A and FIG. 9B.

Referring to FIG. 9A to FIG. 11, the charge control signal SW-H and the discharge control signal SW-L turn on/off the current iup generated from the upper current source I_UP and the current idn generated from the lower current source I_DN to generate an output signal DRV.

The CYC is transmitted to the control signal generator 162 of the timing control unit 160 and the counter 164 of the timing control unit 160 to be used to measure the sensing sensitivity.

The control unit 430 starts the operation in the initial stage 1 and then sequentially operates in the order of the stage 2, the stage 3, the stage 4, the stage 5, the stage 6, the stage 2, the stage 3 (2→3→4→5→6→2→3). The sensing is continuously repeated until the number of sensing cycles defined by the control signal generator 162 and the number of cycles determined from the CYC period are reached.

Referring again to FIG. 9A and FIG. 9B, the charge/discharge circuit unit 450 is connected to the control unit 430 and the transmission/reception switching unit 460. The charge/discharge circuit unit 450 charges the sensing voltage RX input through the upper switch 130 or the sensing voltage RX input through the lower switch 140 from the first reference voltage VREF-H to the second reference voltage VREF-L or discharges the sensing voltage RX from second reference voltage VREF-L to the first reference voltage VREF-H, in response to the discharge control signal SW-H and the discharge control signal SW-L provided from a control unit 430. That is, when the first switch SW_H is turned on and the second switch SW_L is turned off, the charge/discharge circuit unit 450 outputs the charge current iup generated based on the power supply voltage VDD of the power voltage terminal to charge the fingerprint recognition pattern. When the first switch SW_H is turned off and the second switch SW_L is turned on, the charge/discharge circuit unit 450 discharges the discharge current idn corresponding to the charge voltage of the fingerprint recognition pattern through the ground terminal.

The transmission/reception switching unit 460 includes a transmission switch 462 and a reception switch 46. The transmission/reception switching unit 460 switches an output direction of the transmission signal DRV for the driving signal TX and an output direction of the reception signal RCV corresponding to the sensing signal RX in response to a third control signal CON2 provided from an external device.

In the present exemplary embodiment, the third control signal CON2 performs a role of determining a signal transmission path of the transmission/reception switching unit 460. That is, the transmission/reception switching unit 460 sets whether to supply the driving signal TX for fingerprint recognition to a first end of the source line or to a second end of the source line under the control of the third control signal CON2.

Moreover, the transmission/reception switching unit 460 sets whether or not to receive the sensing signal RX according to the fingerprint recognition through a second end of the source line or a first end of the sensing line in response to a third control signal CON2. Accordingly, the driving signal TX may be supplied in a first direction (e.g., a forward direction) or a second direction (e.g., a reverse direction) with respect to the source line. Moreover, the sensing signal RX may be received in the first direction or in the second direction with respect to the source line.

The timing control unit 160 includes a control signal generator 162 and a counter 164. The timing control unit 160 controls operations of the gate driver 120 and the sensing driving unit 150. The timing control unit 160 determines the sensitivity of the touch based on the first direction sensing signal and the second direction sensing signal to measure whether or not the ridge of the user finger is laid on the specific pixel.

Particularly, the control signal generator 162 generates a gate switching signal GS for controlling the operation of the gate driver 120, the first control signal CON0, the second control signal CON1, the charge control signal SW-H, the discharge control signal SW-L, the third control signal CON2 and the fourth control signal CON3 based on a clock CLOCK provided from the counter 164.

The counter 164 counts the number of pulses according to the first direction sensing signal to output the counted number of the first direction sensing signal to an external device, and counts the number of pulses according to the second direction sensing signal to output the counted number of the second direction sensing signal to the external device. The counter 164 measures a charging time and a discharging time of the charging/discharging circuit unit 450 and a time required for the entire charging and discharging in response to the fourth control signal CON3 provided from an external device, and outputs a measurement signal corresponding to the result.

In the present exemplary embodiment, the fourth control signal CON3 controls the operation of the counter 164. For example, in the interval in which the fourth control signal CON3 is at the H level edge, the counter 164 is initialized and simultaneously the counter 164 is operated for a predetermined period of the sensing signal so that the number of clocks is calculated. In the edge period of the L level occurring after the edge period of the first H level, the fourth control signal CON3 stops the operation of the counter 164 and maintains the value of the counter 164 so as to transmit the measurement result.

The operation described above is continuously repeated in the interval in which the second control signal CON1 is at H level. The output value of the counter 164 is recognized as the capacitance value of each pad by the third control signal CON2.

An initial start starts at the output signal of the charge/discharge circuit section 450, that is, the capacitance sense signal is at a ground level of 0V. At this time, the signal has a value lower than the first reference voltage VREF-H and the second reference voltage VREF-L. The second reference voltage VREF-L is typically a voltage slightly higher than GND 0V. For example, the second reference voltage VREF-L may be set to 300 mV. The first reference voltage VREF-H may be set from ½ VDD to VDD-300 mV.

When the capacitance measurement circuit 200 operates in a steady state, the comparator 420 and the control unit 430 are operated to has a linear shape with a slope rising in the form of a triangle wave from the reference voltage VREF-L to the first reference voltage VREF-H when a voltage of the signal is lower than the second reference voltage VREF-L.

On the other hand, when the voltage of the signal reaches the first reference voltage VREF-H, the switch SW is connected to operate so that the capacitance sensing signal has a shape of a sloped straight line that falls in a triangular shape.

Figure 12A:
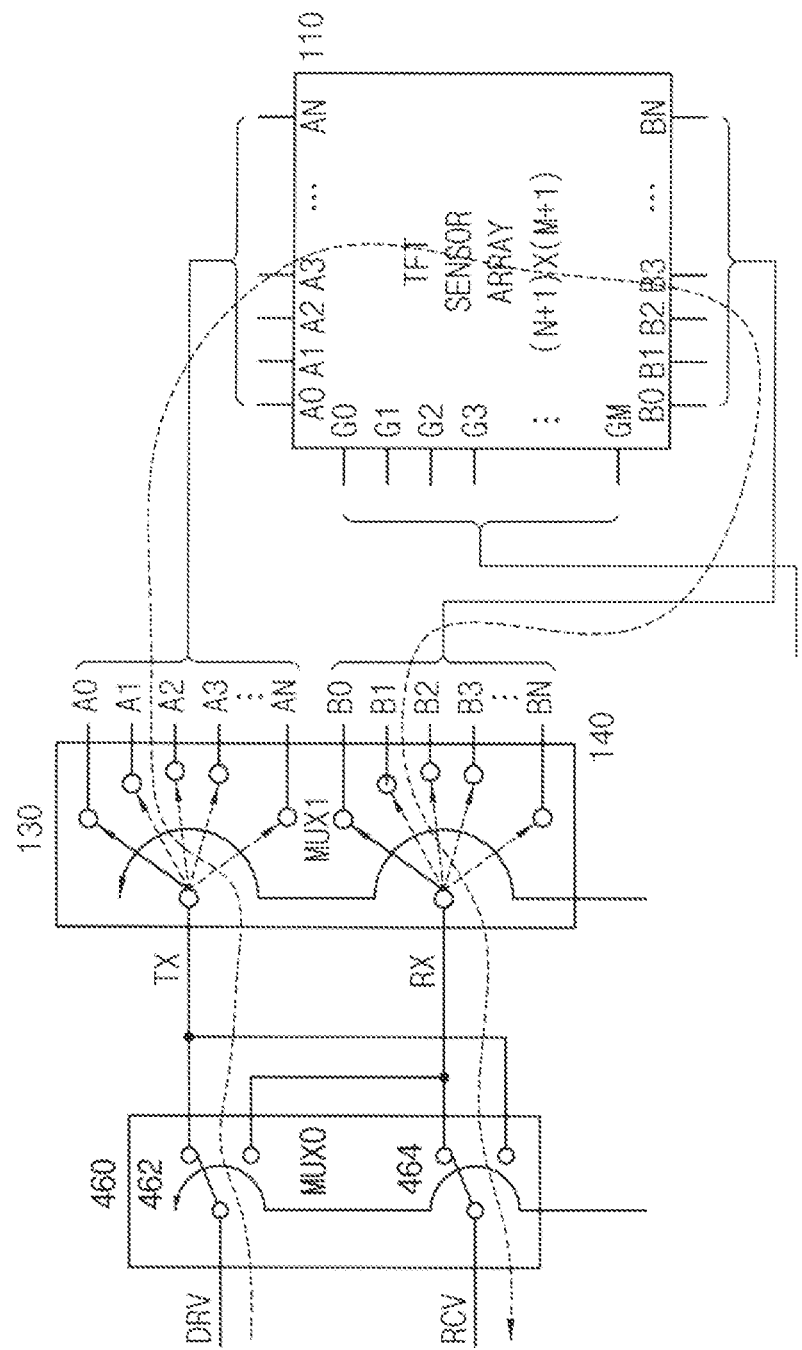
FIG. 12A and FIG. 12B are conceptual diagrams schematically explaining paths of a driving signal and a sensing signal in the fingerprint recognition device shown in FIG. 9A and FIG. 9B.
Figure 12B:
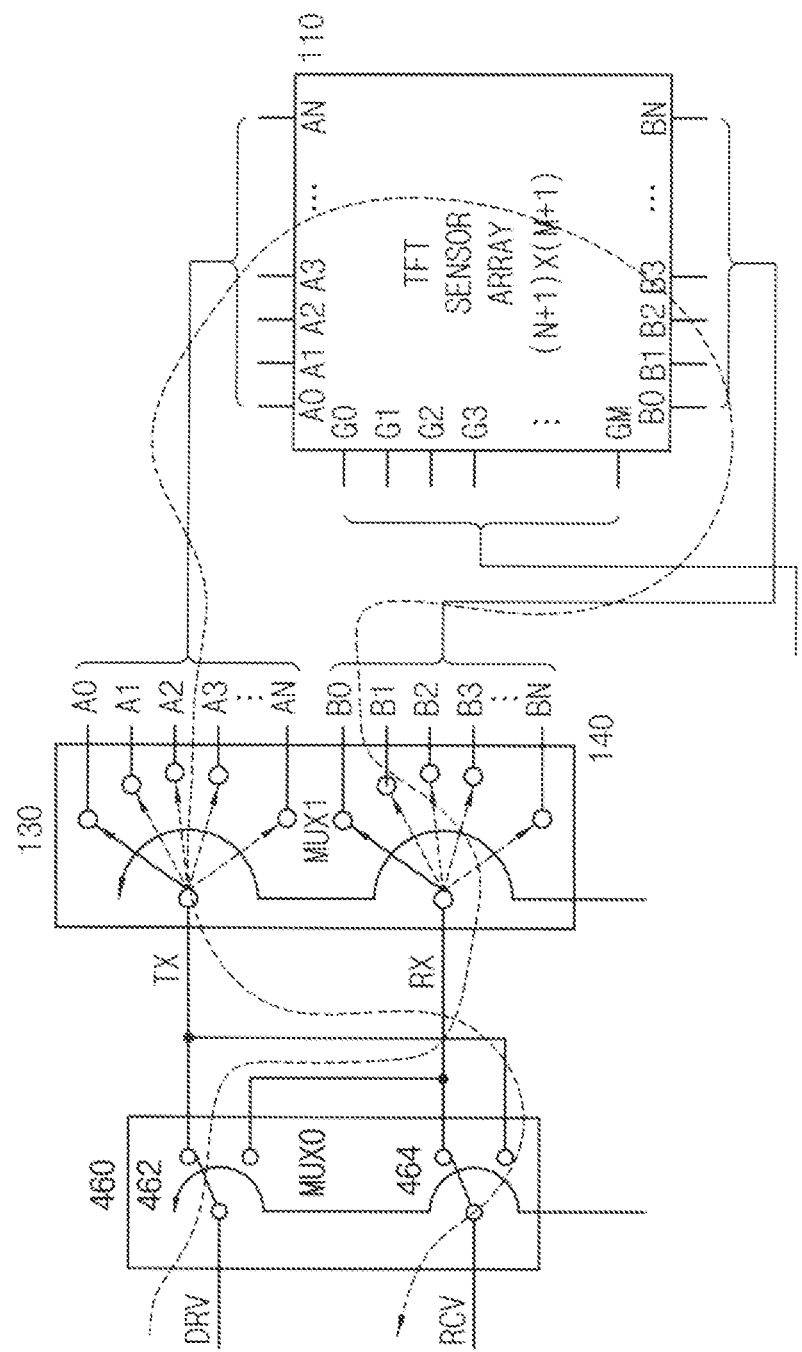

FIG. 12A and FIG. 12B are conceptual diagrams schematically explaining paths of a driving signal and a sensing signal in the fingerprint recognition device shown in FIG. 9A and FIG. 9B. Particularly, FIG. 12A shows a path in which a driving signal is applied through a first end of the source line and a sensing signal is received through a second end of the source line, FIG. 12B shows a path in which a driving signal is applied through the second end of the source line and a sensing signal is received through the second end of the source line.

Referring to FIG. 12A, a driving signal is transmitted from an upper side of the TFT sensor array 110 to a lower side of the TFT sensor array 110, that is through the first end of the source line, and a sensing signal is output through the second end of the source line, so that a change amount of the capacitance is sensed.

When the third control signal CON2 is 0, a first sensing path is formed in which the driving signal DRV is applied to a first end of the source line via the transmission switch 462 of the transmission/reception switching unit 460 and the upper switch 130 and the sensing signal RCV passed through the source line is input via the lower switch 140 and the receiving switch 464 of the transmission/reception switching unit 460 through a second end of the source line.

Referring to FIG. 12B, a driving signal is transmitted from a lower side of the TFT sensor array 110 to a upper side of the TFT sensor array 110, that is through the second end of the source line, and a sensing signal is output through the first end of the source line, so that a change amount of the capacitance is sensed.

When the third control signal CON2 is 1, a second sensing path is formed in which the driving signal DRV is applied to a first end of the source line via the transmission switch 462 of the transmission/reception switching unit 460 and the lower switch 140 and the sensing signal RCV passed through the source line is input via the upper switch 130 and the receiving switch 464 of the transmission/reception switching unit 460 through a first end of the source line.

According to the present invention, since the first sensing path and the second sensing path are opposite to each other in the flow of the signal, the same sensing circuit may be used to adjust the sense path through the complex type switch 460. Thus by obtaining the measured value, the error rate due to the deviation between the internal circuits of the semiconductor may be reduced.

Figure 13:
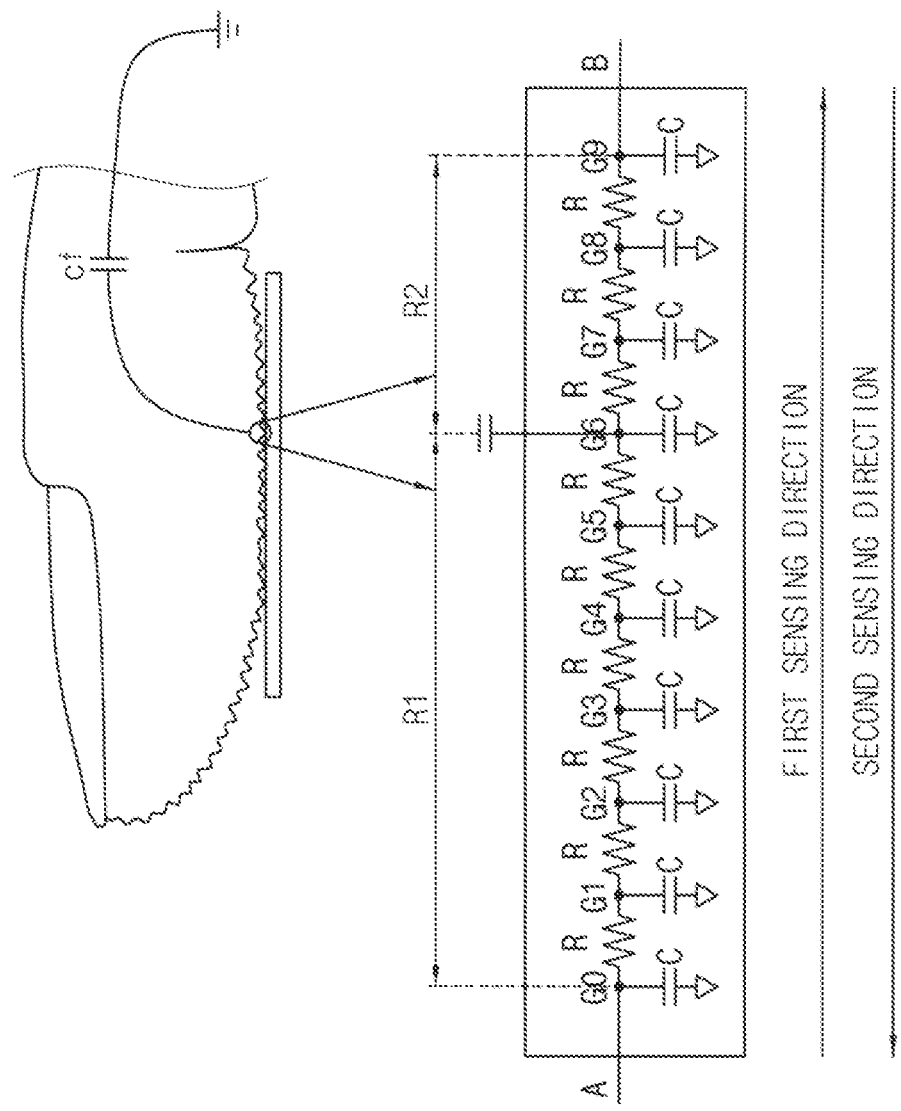
FIG. 13 is a conceptual diagram schematically explaining the principle of capacitance sensing through the TFT sensor array 110 shown in FIG. 9A and FIG. 9B.
Figure 14:
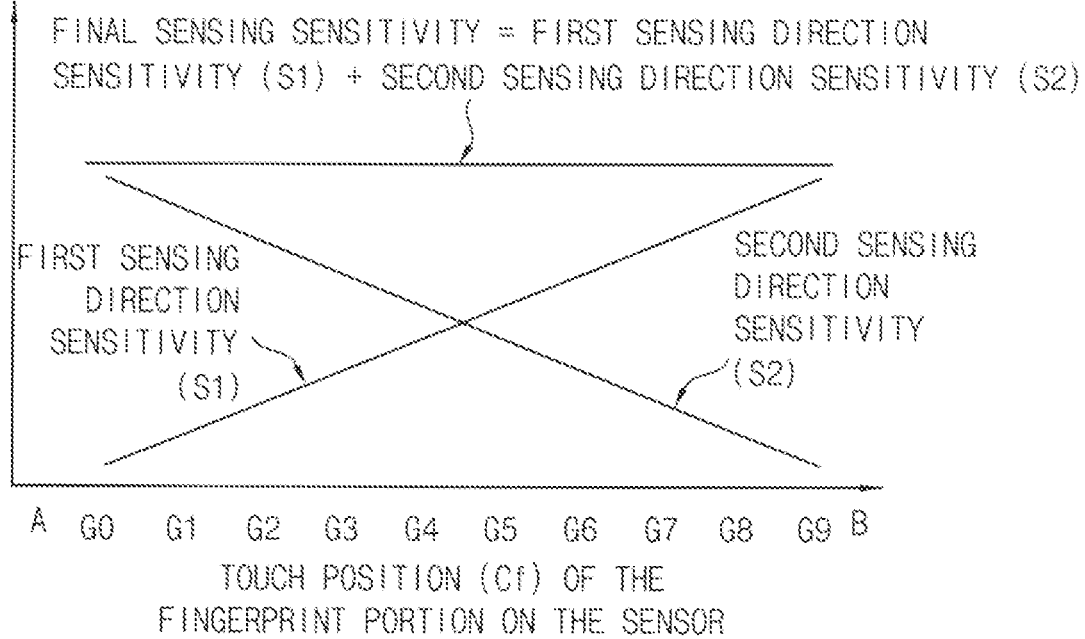
FIG. 14 is a graph schematically explaining a delay of a sensing signal according to a first sensing direction and a second sensing direction shown in FIG. 13.

FIG. 13 is a conceptual diagram schematically explaining the principle of capacitance sensing through the TFT sensor array 110 shown in FIG. 9A and FIG. 9B. FIG. 14 is a graph schematically explaining a delay of a sensing signal according to a first sensing direction and a second sensing direction shown in FIG. 13.

Referring to FIG. 13 and FIG. 147, an example in which eight fingerprint sensors are connected to one source line is shown for convenience of explanation. One fingerprint sensor may be defined as a resistor and a capacitor connected in parallel. It is assumed that the resistance values of the resistors R are equal to each other and the capacitance values of the capacitors C are equal to each other. Since eight fingerprint sensors are disposed thereon, nine nodes G0, G1, G2, G3, G4, G5, G6, G7, G8 and G9 are formed thereon.

It is assumed that the parasitic capacitance C of each node G0 to G9 is a negligible value, and the change of the touch value generated by the ridge and valley of the finger is measured. Here, the ridge as the capacitances corresponding to the touch is assumed to be Cf, and the valley as the capacitances corresponding to the untouched is assumed to be zero.

When the touch Cf occurs at the node G0, the TX delay time constant corresponding to the first sensing direction is $R*0*Cf$ and the TX delay time constant corresponding to the second sensing direction is $R*8*Cf$. Therefore, the sum of the TX delay time constants corresponding to the two directions is $R*8*Cf$. That is, the sum of the TX delay time constants corresponding to the two directions is calculated as $(R*0*Cf)+(R*8*Cf)=R*8*Cf$.

When the touch Cf occurs at the node G1, the TX delay time constant corresponding to the first sensing direction is $R*1*Cf$ and the TX delay time constant corresponding to the second sensing direction is $R*7*Cf$. Therefore, the sum of the TX delay time constants corresponding to the two directions is $R*8*Cf$.

When the touch Cf occurs at the node G6, the TX delay time constant corresponding to the first sensing direction is $R*5*Cf$ and the TX delay time constant corresponding to the second sensing direction is $R*3*Cf$. Therefore, the sum of the TX delay time constants corresponding to the two directions is $R*8*Cf$.

When the touch Cf occurs at the node G9, the TX delay time constant corresponding to the first sensing direction is $R*8*Cf$ and the TX delay time constant corresponding to the second sensing direction is R*0*Cf. Therefore, the sum of the TX delay time constants corresponding to the two directions is R*8*Cf.

As described above, it can be confirmed that the sum of the TX delay time constant corresponding to the first sensing direction and the TX time constant delay time constant corresponding to the second sensing direction is the same at any portion of each node.

Figure 15:
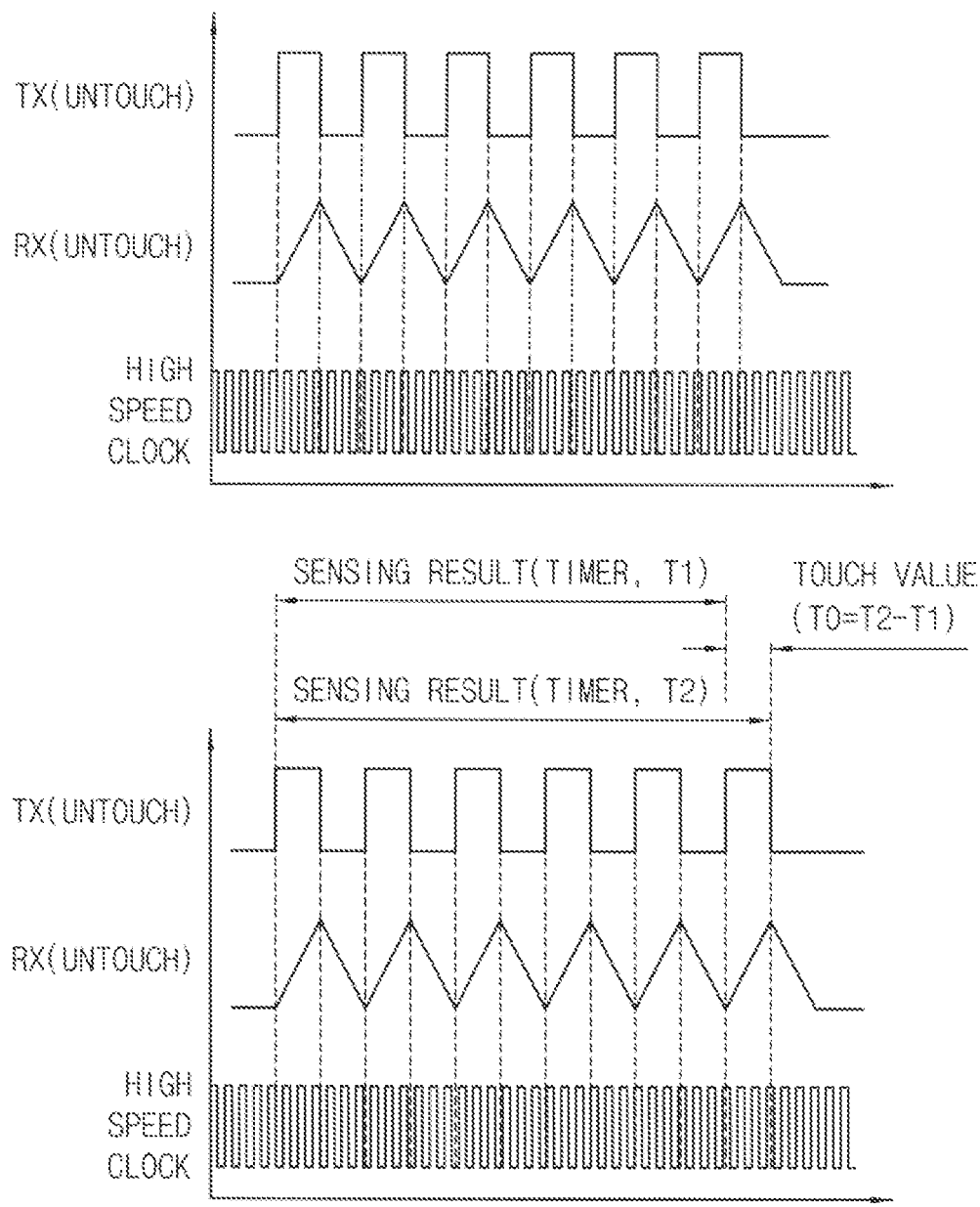
FIG. 15 is a timing diagram corresponding to each valley of a finger and ridge of a finger.

FIG. 15 is a timing diagram corresponding to each valley of a finger and ridge of a finger. An upper diagram of FIG. 15 is a timing diagram assuming that the fingerprint sensor is in an untouched state when the fingerprint sensor meets valleys of the finger, and a lower diagram of FIG. 15 is timing chart assuming that the fingerprint sensor is in a touch state when the fingerprint sensor meets ridges of the finger.

The touch capacitance Cf applied due to the ridge of the finger is increased at the electrode, so that a delay of the time constant of the driving signal TX and the sensing signal RX occurs. When the delayed time after the CYC is measured with a high-speed clock, the measurement difference value T0 for the case of the ridge T2 and the case of the valley T1 is obtained. Through this combination of information, the images of ridges and valleys in each fingerprint sensor array becomes the image of the fingerprint.

Figure 16A:
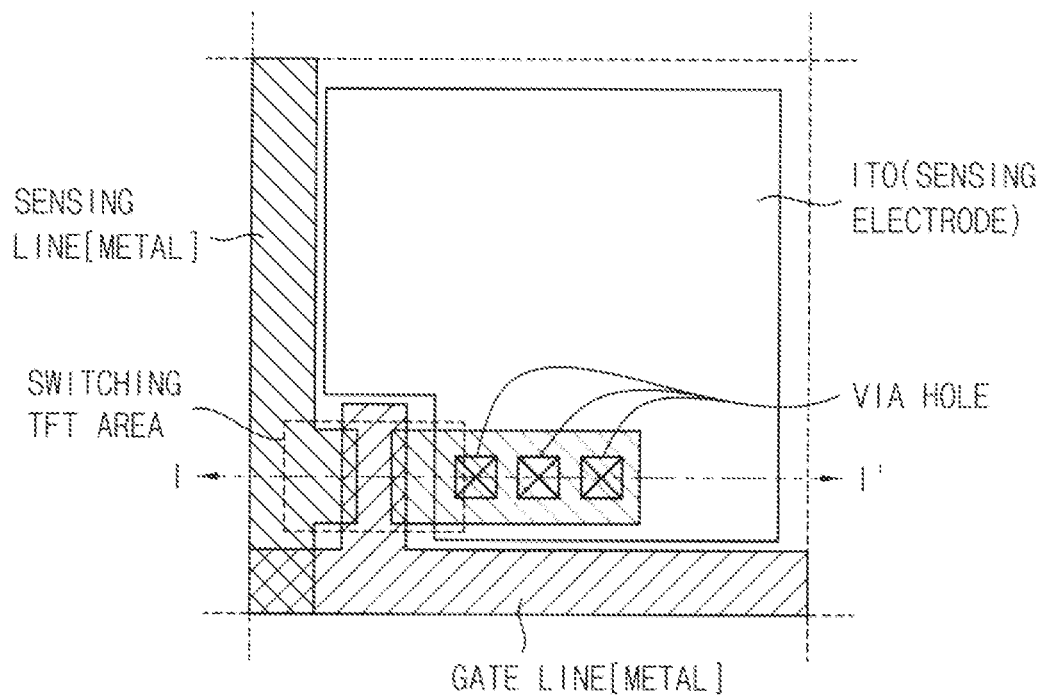
FIG. 16A is a plan view schematically explaining an example of the fingerprint sensor.
Figure 16B:
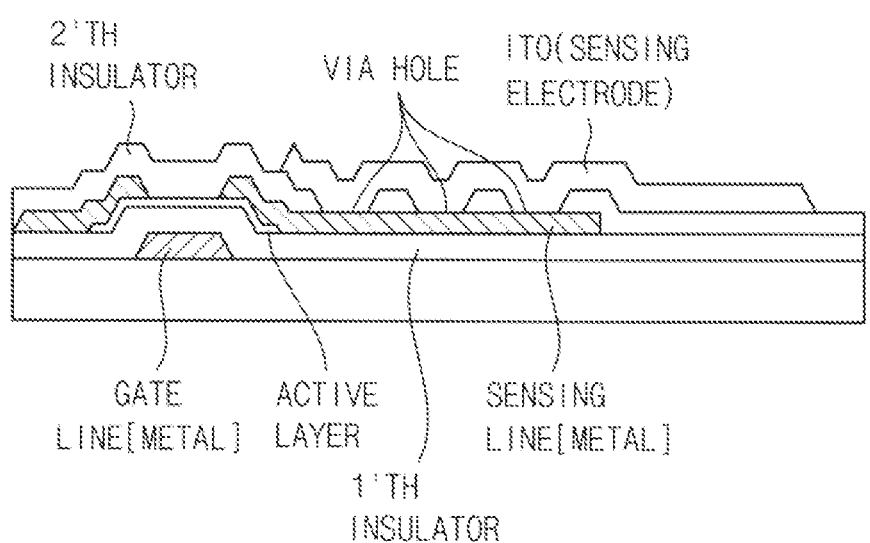
FIG. 16B is a sectional view taken along line I-I' of the fingerprint sensor of FIG. 10A.

FIG. 16A is a plan view schematically explaining an example of the fingerprint sensor, and FIG. 16B is a sectional view taken along line I-I' of the fingerprint sensor of FIG. 10A.

Referring to FIG. 16A and FIG. 16B, the fingerprint sensor includes a base film, a gate line formed on the base film in the first direction, a gate electrode protruding from the gate line, a first insulating layer covering the gate line and the gate electrode, and a semiconductor layer formed in a channel area of the TFT.

The fingerprint sensor includes a source line formed on the first insulating layer in the second direction, a source electrode protruding from the source line and covering a portion of the semiconductor layer, a drain electrode spaced apart from the source electrode to cover a portion of the semiconductor layer, and a second insulating layer covering the source line, the source electrode and the drain electrode.

The fingerprint sensor includes a fingerprint recognition pattern formed in an area defined by gate lines adjacent to each other and source lines adjacent to each other. The fingerprint recognition pattern is connected to the drain electrode through via holes formed through the second insulation layer.

The fingerprint sensor shown in FIG. 16A and FIG. 16B is manufactured through a Low-Temperature Poly Silicon (LTPS) process. Typically, the LTPS process is performed at a process temperature of about 450 degrees Celsius or less. When the base film according to the present embodiment is formed of polyimide, it may be formed at a process temperature of about 380 degrees Celsius.

Figure 17A:
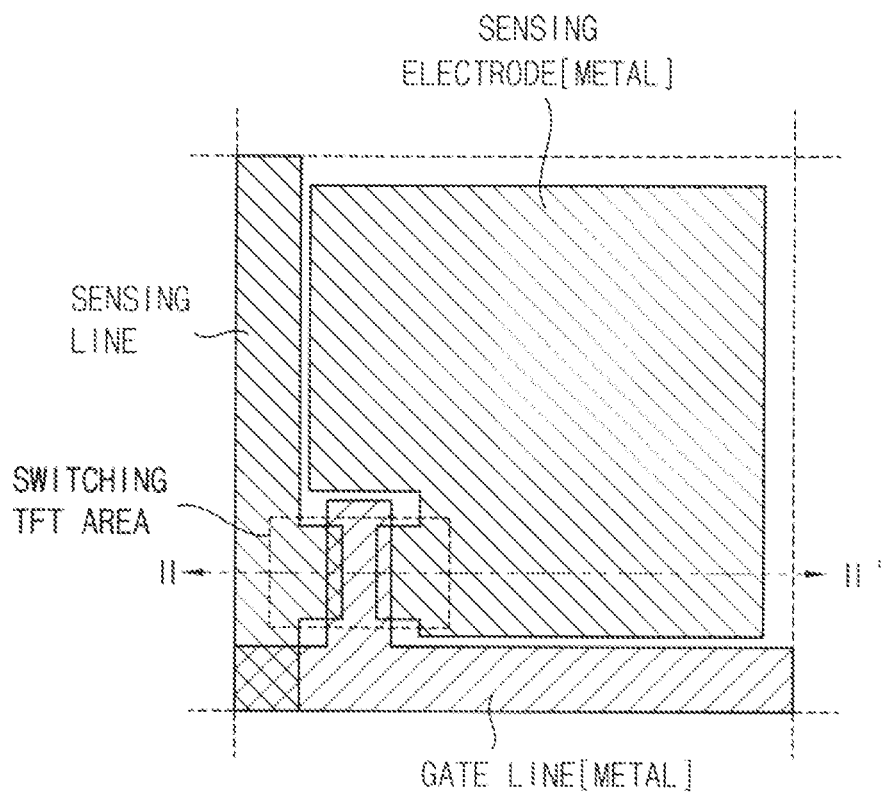
FIG. 17A is a plan view schematically explaining another example of the fingerprint sensor.
Figure 17B:
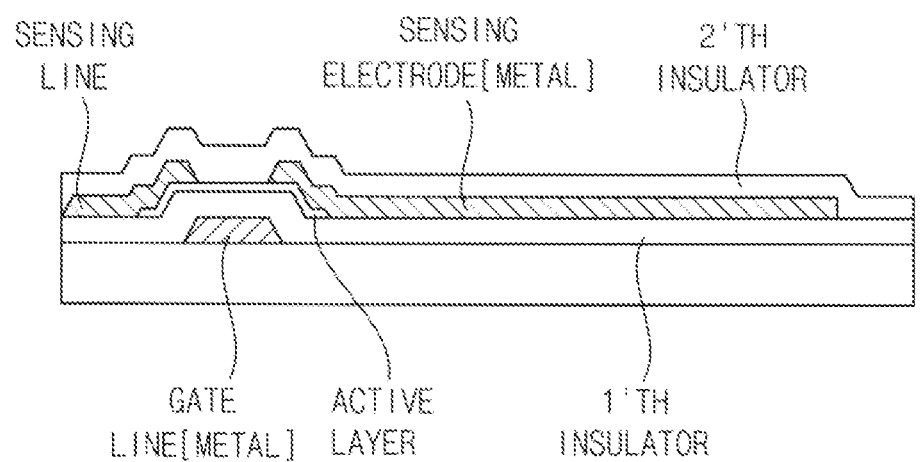
FIG. 17B is a cross-sectional view taken along line II-II' of the fingerprint sensor of FIG. 17A.

FIG. 17A is a plan view schematically explaining another example of the fingerprint sensor, and FIG. 17B is a cross-sectional view taken along line II-II' of the fingerprint sensor of FIG. 17A.

Referring to FIG. 17A and FIG. 17B, the fingerprint sensor includes a base film, a gate line formed on the base film in a first direction, a gate electrode protruding from the gate line, a first insulating layer covering the gate line and the gate electrode, and a semiconductor layer formed in a channel area of the TFT.

The fingerprint sensor includes a source line formed on the first insulating layer in the second direction, a source electrode protruding from the source line to cover a portion of the semiconductor layer, a drain electrode spaced apart from the source electrode to cover a portion area of the semiconductor layer, and a second insulating layer covering the source line, the source electrode and the drain electrode.

In the present exemplary embodiment, the drain electrode is extended to cover an area defined by gate lines adjacent to each other and source lines adjacent to each other, thereby defining the fingerprint recognition pattern.

The fingerprint sensor shown in FIG. 17A and FIG. 17B is manufactured through a Low-Temperature Poly Silicon (LTPS) process. Typically, the LTPS process is performed at a process temperature of about 450 degrees Celsius or less. When the base film according to the present exemplary embodiment is formed of polyimide, it may be formed at a process temperature of about 380 degrees Celsius.

As described above, according to the present invention, capacitive fingerprint recognition sensors are manufactured through a flexible film-based TFT sensor array rather than a silicon wafer-based TFT sensor array. That is, by manufacturing the capacitive fingerprint recognition sensors using a technology for manufacturing a TFT sensor array based on LTPS used for manufacturing a LCD and a technology for manufacturing a TFT sensor array based on a flexible film used for manufacturing a flexible display, it is possible to solve a shortage of silicon wafers generated when a fingerprint recognition sensor is manufactured through a silicon wafer-based TFT sensor array.

Moreover, by performing a hard coating process and/or a design print process on a rear surface or an upper surface of the flexible film on which the TFT sensor array is formed, a glass cover window process may be omitted, and mass production is possible.

Moreover, the manufacturing cost may be reduced because the wire bonding process, the molding process and the cover window process can be omitted, which are necessary in a technology for realizing the capacitive fingerprint recognition sensor using the silicon wafer-based TFT sensor array.

On the other hand, since the distance from the silicon wafer to the fingerprint recognition touch surface is required to be about 300 μm or more, it is very difficult to derive the sensitivity of the fingerprint recognition because the distance between the fingerprint sensor electrode and the finger is far. In contrast, since the flexible film has a thickness of several tens micrometer, the distance between the fingerprint sensor of the capacitive type and the fingerprint is shortened to within about 100 μm, and the touch sensitivity is greatly improved.

Moreover, a packaging process such as a ball grid array (BGA) of a sensor die required in a silicon wafer-based fingerprint sensor process (for example, a wire bonding and a molding process on a PCB) may be omitted, so that the yield may be improved and the manufacturing cost may be reduced.

Moreover, since a flexible PCB (FPCB) for signal connection between a system and a fingerprint recognition BGA package may be omitted, a process may be simplified. In addition, the yield may be improved and the manufacturing cost may be reduced.

Moreover, when a silicon-based 8-inch silicon wafer is used, a circular wafer having a diameter of about 200 mm is high in price and small in area, so that the amount of manufactured goods is small. In contrast, since the manufacturing process of the flexible TFT film used in the present invention is used, it is possible to improve the productivity and to reduce the manufacturing cost.

That is, even if a fifth generation process (that is, a manufacturing process of a substrate having a size of 1300 mm×1100 mm) is used as a display manufacturing process, it is much lower than the manufacturing cost of an 8-inch silicon wafer. Further, it is possible to use a rectangular TFT substrate of 1300 mm×1100 mm having a large area. Therefore, it is possible to improve the productivity and to reduce the manufacturing cost.

Having described exemplary embodiments of the present invention, it is further noted that it is readily apparent to those of reasonable skill in the art that various modifications may be made without departing from the spirit and scope of the invention which is defined by the metes and bounds of the appended claims.

[Description of reference numerals]

| | |
|---|---|
| 110: a TFT sensor array | 120: a gate driver |
| 130: an upper switch | 140: a lower switch |
| 150: a sensing driving unit | 160: a timing control unit |
| 200: a capacitance measurement circuit | 410: a reference voltage generator |
| 420: a voltage comparison unit | 430: a control unit |
| 450: a charge/discharge circuit unit | 460: a transmission/reception switching unit |
| COMP_UP: a first voltage comparator | COMP_DN: a second voltage comparator |
| 500: a fingerprint sensor module | 510: a base film |
| 511: a fingerprint sensing area | 512: a wing area |
| 513: a first signal connecting area | 514: a component mounting area |
| 515: a second signal connecting area | 516: a connecting area |
| 512a: a first wing portion | 512b: a second wing portion |
| 520: a first signal lines | 530: an external component |
| 540: a second signal lines | 610, 710: a first reinforcing plate |
| 612, 712: a shield electrode layer | 620: a second reinforcing plate |
| 630, 740: a metal ring | 640, 750: a space replenishment film |
| 650: a third reinforcing plate | 660, 770: a damage prevention layer |
| 720: a first supporting plate | 730: a second supporting plate |
| 760: a third supporting plate | |

What is claimed is:

1. A fingerprint sensor module comprising:
    a base film comprising a fingerprint sensing area, a wing area surrounding the fingerprint sensing area, a first signal connecting area adjacent to the fingerprint sensing area, a component mounting area adjacent to the first signal connecting area, and a second signal connecting area adjacent to the component mounting area;
    a thin-film transistor (TFT) sensor array formed in the fingerprint sensing area;
    a plurality of first signal lines formed in the first signal connecting area to have one end connected to the TFT sensor array;
    an external component mounted on the component mounting area to have one end connected to each of the first signal lines;
    a plurality of second signal lines formed in the second signal connecting area to have one end connected to the external component;
    a gate driver sequentially providing a gate signal to the TFT sensor array;
    an upper switch connected to a first side of the TFT sensor array to switch an output path of a driving signal for fingerprint recognition and a sensing signal according to fingerprint recognition; and
    a lower switch connected to a second side of the TFT sensor array to switch an output path of a drive signal for fingerprint recognition and a sensing signal according to the fingerprint recognition.

2. The fingerprint sensor module of claim 1, wherein the base film comprises a first conductive pattern formed on a portion area of the wing area for connection of a shield signal or a control signal.

3. The fingerprint sensor module of claim 2, wherein a cut portion defined by a cutting line and a connection portion adjacent to the cut portion are formed in the wing area and the component mounting area which are adjacent to each other,
    wherein a first wiring connected to the first conductive pattern extends to the component mounting area via the connection portion.

4. The fingerprint sensor module of claim 2, wherein the base film further comprises a second conductive pattern formed on another portion area of the wing area for connection of a shield signal to a lower portion of an outer metal ring.

5. The fingerprint sensor module of claim 4, wherein a cut portion defined by a cutting line and a connection portion adjacent to the cut portion are formed in the wing area and the component mounting area which are adjacent to each other,
    wherein a second wiring connected to the second conductive pattern extends to the component mounting area via the connection portion.

6. The fingerprint sensor module of claim 1, wherein the base film further comprises a connecting area adjacent to the second signal connecting area.

7. The fingerprint sensor module of claim 6, further comprising a connector portion disposed in the connecting area.

8. The fingerprint sensor module of claim 1, wherein the TFT sensor array comprises a plurality of gate lines, a plurality of source lines, a plurality of TFTs connected to gate lines and source lines, and a plurality of fingerprint recognition patterns connected to the TFTs, respectively.

9. The fingerprint sensor module of claim 1, further comprising a plurality of gate lines, a plurality of source lines, and a plurality of TFTs connected to the gate line and the source line,
    wherein a drain electrode of each of the TFTs is extended to define a fingerprint recognition pattern.

10. The fingerprint sensor module of claim 1, wherein the gate driver, the upper switch and the lower switch are formed in the fingerprint sensing area.

11. The fingerprint sensor module of claim 1,
    during a first time, wherein the upper switch provides a drive signal for fingerprint recognition provided from an outside to a first end of the TFT sensor array, and the lower switch provides a sensing signal according to the fingerprint recognition received through a second end of the TFT sensor array to the outside, and during a second time, wherein the lower switch provides a drive signal for fingerprint recognition provided from an outside to the second end of the TFT sensor array, and the upper switch provides a sensing signal according to the fingerprint recognition received through the first end of the TFT sensor array to the outside.

12. The fingerprint sensor module of claim 1, further comprising a coating layer covering the first signal lines and the second signal lines.

\* \* \* \* \*